(12) United States Patent
Sim et al.

(10) Patent No.: US 11,251,395 B2
(45) Date of Patent: Feb. 15, 2022

(54) APPARATUS AND METHOD FOR MANUFACTURING DISPLAY DEVICE

(71) Applicant: Samsung Display Co., LTD., Yongin-si (KR)

(72) Inventors: Jae Young Sim, Anyang-si (KR); Seon Ah Kim, Cheonan-si (KR); Kyung Ho Jung, Seongnam-si (KR); Ni El Han, Bucheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 76 days.

(21) Appl. No.: 16/861,168

(22) Filed: Apr. 28, 2020

(65) Prior Publication Data

US 2020/0350509 A1 Nov. 5, 2020

(30) Foreign Application Priority Data

May 2, 2019 (KR) .................. 10-2019-0051409

(51) Int. Cl.
| | | |
|---|---|---|
| *H01L 51/52* | (2006.01) | |
| *H01L 27/32* | (2006.01) | |
| *H01L 51/56* | (2006.01) | |
| *H01L 51/00* | (2006.01) | |

(52) U.S. Cl.
CPC ........ *H01L 51/524* (2013.01); *H01L 27/3244* (2013.01); *H01L 51/0097* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 9,337,433 B2 | 5/2016 | Lim et al. | |
| 9,498,938 B2 | 11/2016 | Son et al. | |
| 9,981,417 B2 | 5/2018 | Park et al. | |
| 10,207,483 B2 | 2/2019 | Son et al. | |
| 10,559,489 B2 | 2/2020 | Son et al. | |
| 2011/0146893 A1* | 6/2011 | Marty | B29D 11/00903 156/212 |
| 2014/0002973 A1* | 1/2014 | Lee | H04M 1/0268 361/679.01 |
| 2014/0345791 A1* | 11/2014 | Son | H01L 51/0024 156/228 |
| 2016/0202728 A1* | 7/2016 | Kim | H01L 21/67092 29/739 |
| 2017/0265340 A1* | 9/2017 | Son | H05K 5/03 |

(Continued)

FOREIGN PATENT DOCUMENTS

| | | |
|---|---|---|
| KR | 10-2014-0065659 | 5/2014 |
| KR | 10-2014-0139361 | 12/2014 |
| KR | 10-2015-0133893 | 12/2015 |

(Continued)

*Primary Examiner* — J. E. Schoenholtz
(74) *Attorney, Agent, or Firm* — H.C. Park & Associates, PLC

(57) ABSTRACT

A method for manufacturing a display device includes the steps of: placing a panel having a first portion and a second portion on a deformable pad having a core member and placing a cover window on the panel; and moving the core member disposed inside the pad from the first portion to the second portion of the panel and pressing the panel to bond the cover window to the panel.

31 Claims, 23 Drawing Sheets

(56) References Cited

U.S. PATENT DOCUMENTS

2020/0203672 A1* 6/2020 Kuon .................. H01L 51/5246

FOREIGN PATENT DOCUMENTS

| KR | 10-2017-0023267 | 3/2017 |
| KR | 10-2017-0094019 | 8/2017 |
| KR | 10-2017-0106552 | 9/2017 |
| KR | 10-2015-0048547 | 3/2020 |

* cited by examiner (a)

(b)

APPARATUS AND METHOD FOR MANUFACTURING DISPLAY DEVICE

CROSS-REFERENCE TO RELATED APPLICATION

This application claims priority from and the benefit of Korean Patent Application No. 10-2019-0051409 filed on May 2, 2019, which is hereby incorporated by reference for all purposes as if fully set forth herein.

BACKGROUND

Field

Exemplary implementations of the invention relate generally to display devices and, more specifically, to an apparatus and method for manufacturing a display device capable of uniformly bonding a curved window to a curved display panel.

Discussion of the Background

Recently, a flexible display device has been developed, which is light weight and has strong impact resistance and includes a flexible substrate made of a material such as plastic. The flexible display device can be folded or rolled up for easy carriage and can be used in various fields.

The flexible display device includes display elements formed on a flexible substrate. The display elements, which can be used for the flexible display device, may include organic light emitting display elements, liquid crystal display elements, and the like.

The display elements commonly include thin film transistors. Accordingly, the flexible substrate undergoes a plurality of thin film processes. The flexible substrate having undergone the thin film processes is encapsulated by an encapsulation layer. The flexible substrate, the thin film transistors formed on the flexible substrate, and the encapsulation layer constitute a display panel of the display device.

Generally, a cover window for protecting the display panel is attached to a front surface of the display panel. In this case, a bonding agent is interposed between the display panel and the cover window, and the display panel and the cover window are bonded to each other.

Recently, a side-view display device has been developed, which includes a main display area in which a main image is displayed and an auxiliary display area in which a sub-image is displayed on a curved side portion. The cover window of the side-view display device has a curved structure with curved portions that extend over the side portions of the side-view display device.

The above information disclosed in this Background section is only for understanding of the background of the inventive concepts, and, therefore, it may contain information that does not constitute prior art.

SUMMARY

Applicant discovered that the bonding force required to connect a curved window member to a curved display panel may be insufficient for reliable bonding and/or may create excessive pressures that can damage the sensitive electronic components of the display.

Apparatus (e.g., lamination apparatus) for manufacturing display device constructed according to exemplary implementations of the invention and methods of manufacturing the same according to the exemplary embodiments of the invention are capable of uniformly bonding a curved window to a curved display panel.

Additional features of the inventive concepts will be set forth in the description which follows, and in part will be apparent from the description, or may be learned by practice of the inventive concepts.

According to an aspect of the invention, a method for manufacturing a display device includes the steps of: placing a panel having a first portion and a second portion on a deformable pad having a core member; placing a cover window on the panel; and moving the core member disposed inside the pad from a first position adjacent the first portion to a second position adjacent the second portion of the panel and pressing the panel to bond the cover window to the panel.

The panel bent portion of the target panel may include a panel bent portion adjacent to the first portion of the panel, and a panel side portion spaced apart from the first portion of the panel with the panel bent portion interposed therebetween, and the cover window includes a cover flat portion, a cover bent portion, the cover bent portion may include a cover bending portion adjacent to the cover flat portion, and a cover side portion spaced apart from the cover flat portion with the cover bending portion interposed therebetween.

The step of moving the core member and pressing the panel to bond the cover window to the panel may include the step of raising the pad to bond the panel flat portion to the cover flat portion.

The method may further include the step of after raising the pad to bond the first portion to the cover flat portion, bonding the panel bending portion to the cover bending portion by pressing the panel bending portion with the core member.

The method may further include the step of after bonding the panel bending portion to the cover bending portion by pressing the panel bending portion with the core member, bonding the panel side portion to the cover side portion by pressing the panel side portion with the core member.

The step of raising the pad to bond the first portion to the cover flat portion may further include the step of pressing the pad to move a constituent material of the pad to a periphery thereof.

The core member may be moved from the first position to the second position by the constituent material of the pad moving to the periphery.

The method may further include the step of placing a guide member between the pad and the panel, the guide member extending beyond opposite ends of the panel.

The method may further include the step of fixing, with clamps, portions of the guide member extending beyond the ends of the pad.

The method may further include the step of after fixing, with clamps, portions of the guide member extending beyond the ends of the pad, lowering the clamps to lower the portions of the guide member extending beyond the ends of the pad.

The method may further include the step of after lowering the clamps to lower the portions of the guide film extending beyond the ends of the pad, moving roller portions fixed on the clamps toward the pad.

When the roller portions fixed on the clamps are moved inwardly toward the shape pad, the panel bent portion of the target panel may be formed.

The deformable pad may include a shape pad and the core member may include a rigid core connection portion connected to a pad support member disposed below the pad, and a main rigid core portion disposed inside the pad and connected to the rigid core connection portion.

The core connection portion may include a rotation axis of the main core portion, and the step of moving the core member and pressing the panel to bond the cover window to the panel may further include the step of moving the main core portion from the first position to the second position with the core connection portion serving as a rotation axis.

The core member may further include a sub-core portion extending in a direction intersecting a longitudinal direction of the main core portion.

The step of moving the main core portion from the first position to the second position with the core connection portion as a rotation axis may further include the step of bringing the sub-core portion into contact with a surface of the pad.

The step of moving the core member and pressing the panel to bond the cover window to the target panel may further include the step of moving the core member without contacting any outer surfaces of the pad.

According to another aspect of the invention, an apparatus for manufacturing a display includes a support member; a motor disposed below support member and operable to move the support member linearly; a deformable pad disposed on the support member; and a core member connected and disposed inside the support member.

The support member may include a pad support having main support portion, a first sub-support portion disposed on one side of the main support portion, and a second sub-support portion disposed on the other side of the main support portion, and the main support portion may have a first thickness and the first sub-support portion has a second thickness of and the second sub-support portion has a third thickness, with the first thickness being greater that the second or third thickness.

The main support portion may include a groove recessed from a surface thereof, and the core member may include a rigid core connection portion engaged with the groove of the main support portion and a main rigid core portion connected to the rigid core connection portion.

The deformable pad may include a main pad portion overlapping the main support portion, a first sub-pad portion overlapping the first sub-support portion, and a second sub-pad portion overlapping the second sub-support portion, and the main pad portion, the first sub-pad portion and the second sub-pad portion have a substantially uniform surface height.

The main pad portion may have a first thickness and the first sub-pad portion may have a second thickness, with the first thickness being smaller than the second thickness.

The main core portion of the core member may be disposed inside each of the first sub-pad portion and the second sub-pad portion of the deformable pad.

An end of the main core portion may be located inside each of the first sub-pad portion and the second sub-pad portion.

The deformable pad may include silicon (Si), and the main rigid core portion may include a metal material.

The core member may further include a rigid sub-core portion connected to the rigid main core portion and extending in a direction intersecting a longitudinal axis of the rigid main core portion.

The rigid sub-core portion may be in contact with surfaces of at least one of the first sub-pad portion and the second sub-pad portion.

An end of the sub-core portion may have a pointed shape or a curved shape.

An end of the rigid main core portion may have a pointed shape or a curved shape.

The rigid main core portion has a width that gradually may decrease from a portion connected to the rigid core connection portion to an end of the rigid main core portion.

The support member may include a main support portion, a first sub-support portion disposed on one side of the main support portion in a first direction, a second sub-support portion disposed on the other side of the main support portion in the first direction, a third sub-support portion disposed on one side of the main support portion in a second direction intersecting the first direction, and a fourth sub-support portion disposed on the other side of the main support portion in the second direction, and the main support portion may have a thickness larger than that of each of the sub-support portions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
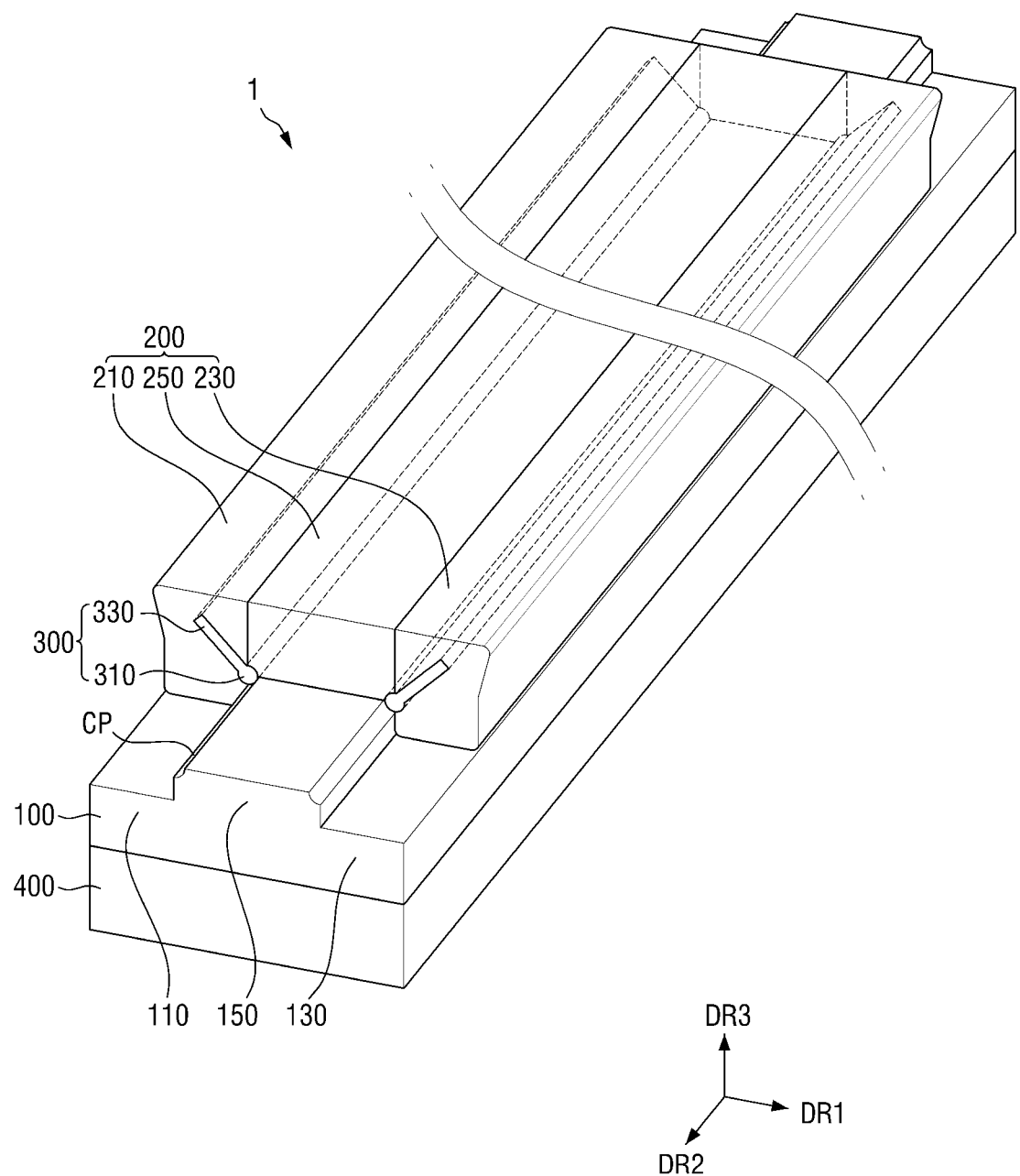
FIG. 1 is a perspective view of an exemplary embodiment of a lamination apparatus constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
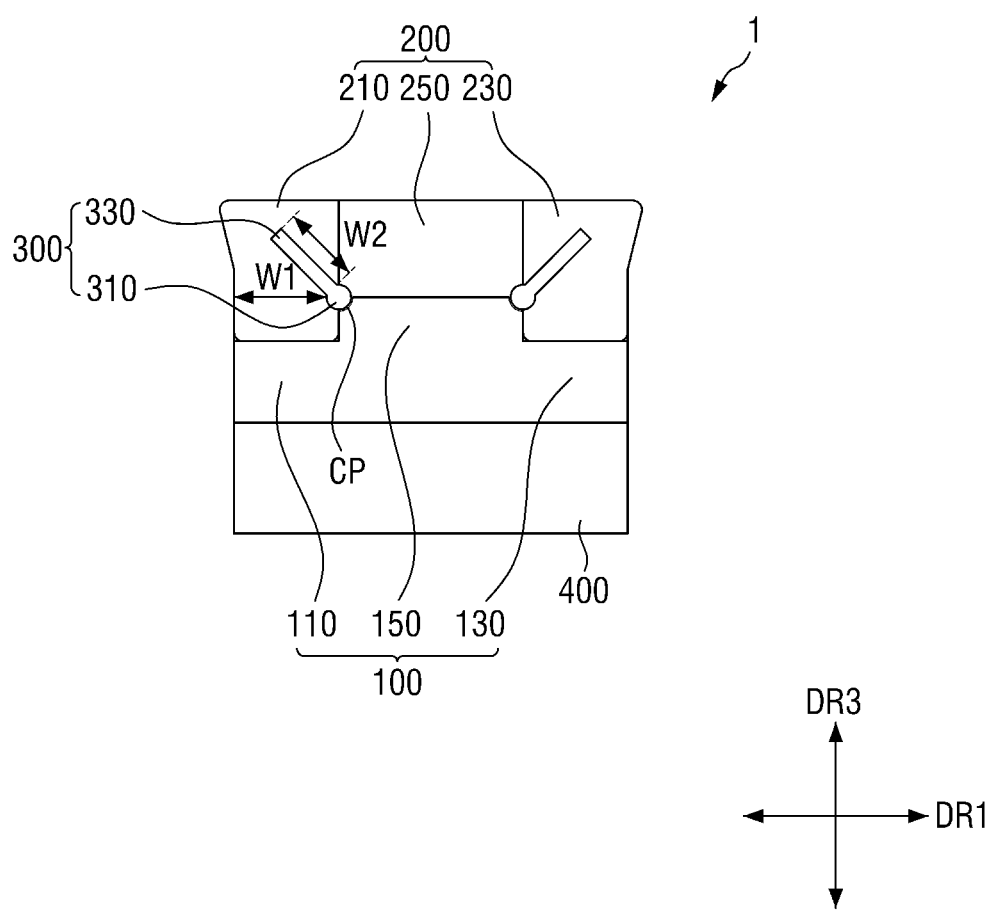
FIG. 2 is a cross-sectional view of the lamination apparatus of FIG. 1.

FIG. 1 is a perspective view of an exemplary embodiment of a lamination apparatus constructed according to the principles of the invention. FIG. 2 is a cross-sectional view of the lamination apparatus of FIG. 1.

Referring to FIGS. 1 and 2, a lamination apparatus 1 may include a shape pad support 100, a shape pad 200 disposed on the shape pad support 100, rigid cores 300 disposed inside the shape pad 200, and a vertical motor 400 disposed below the shape pad support 100.

The lamination apparatus 1 serves to laminate a cover window and a target panel of a display device. That is, the lamination apparatus 1 may attach the target panel to the cover window through an inter-module adhesive member disposed over substantially the entire surface of the target panel. Thus, the lamination apparatus 1 is an apparatus for manufacturing a display device. A detailed description of a process of laminating the target panel and the cover window by the lamination apparatus 1 will be described later.

The shape pad support 100 may serve to support the shape pad 200 disposed thereabove. The shape pad support 100 may include short side portions extending along a first direction DR1 and long side portions extending along a second direction DR2 in plan view as shown in FIG. 1.

The shape pad support 100 may include a metal material. Examples of the metal material may include, but not limited to, aluminum.

The shape pad support 100 may include a main support portion 150, a first sub-support portion 110 disposed at one side of the main support portion 150 in the first direction DR1, and a second sub-support portion 130 disposed on the other side of the main support portion 150 in the first direction DR1.

The thickness of the main support portion 150 in a third direction DR3 may be greater than the thickness of the first sub-support portion 110 and the second sub-support portion 130 adjacent thereto in the third direction DR3. Accordingly, the surface of the main support portion 150 may protrude upwardly in the third direction DR3 from the surface of the first sub-support portion 110 and the second sub-support portion 130 as shown in FIG. 1.

The main support portion 150 may further include attachment portions CP to which the rigid cores 300 are bonded. The attachment portions CP of the main support portion 150 may be recessed in a curved shape in a thickness direction from the surface of the main support portion 150 as shown in FIG. 1. The recessed, curved shape of the attachment portions CP are best shown in FIGS. 15A-C and FIGS. 19A-B, and form a seat for receiving and physically coupling the core connection portions 310 of the rigid cores 300 for rotational movement, as described later. The attachment portions CP of the main support portion 150 may be located, respectively, at one end of the main support portion 150 in the first direction DR1 and at the other end of the main support portion 150 in the first direction DR1. The attachment portions CP of the main support portion 150 may be formed to extend along the second direction DR2.

The shape pad 200 may be disposed on the shape pad support 100 and fixedly secured thereto. Thus, when the shape pad support 100 is raised, the shape pad 200 is also raised. As described later, a guide film on the shape pad 200, a target panel on the guide film and the inter-module adhesive member are brought into contact with the cover window to cause deformation, thereby attaching the target panel to the cover window.

The shape pad 200 may have a rectangular shape in plan view as shown in FIG. 1. That is, the shape pad 200 may include short side portions extending along the first direction DR1 and long side portions extending along the second direction DR2, similarly to the shape pad support 100. However, the exemplary embodiment is not limited thereto, and the planar shape of the shape pad 200 may have various shapes such as a square, a circle, an ellipse or other polygons. Hereinafter, for simplicity of description, the case where the planar shape of the shape pad 200 is a rectangular shape including the short side portions and the long side portions will be mainly described.

The shape pad 200 may include an elastic material having a higher elasticity than the shape pad support 100. For example, the shape pad 200 may include a material such as silicon (Si). Thus, even if shape deformation occurs while the shape pad support 100 is being raised into contact with the cover window as described above, it is possible to prevent physical damage of the target panel and the cover window.

In addition, the shape pad 200 may include an elastic material having a higher elasticity than the constituent material of the rigid cores 300, which will be described later. Accordingly, it is possible to minimize the resistance to movement of the rigid cores 300 inside the shape pad 200 as the shape pad 200 is pressed.

The shape pad 200 may include a main pad portion 250 overlappingly disposed on the main support portion 150, a first sub-pad portion 210 overlappingly disposed on the first sub-support portion 110, and a second sub-pad portion 230 overlappingly disposed on the second sub-support portion 130.

In an exemplary embodiment, the constituent materials of the main pad portion 250, the first sub-pad portion 210, and the second sub-pad portion 230 may have substantially the same density.

In some exemplary embodiments, the constituent materials of the first sub-pad portion 210 and the second sub-pad portion 230 may have densities smaller than that of the constituent material of the main pad portion 250, which may further facilitate the movement of the rigid cores 300 disposed inside the second sub-pad portion 230 and the first sub-pad portion 210 as described later.

The rigid cores 300 may extend along the second direction DR2 as shown in FIG. 1. The rigid cores 300 may include core connection portions 310 physically connected to the attachment portions CP of the main support portion 150 of the shape pad support 100, and main core portions 330 connected to the core connection portions 310 and disposed inside the sub-pad portions 210 and 230.

The core connection portions 310 of the rigid cores 300 may be physically coupled to the attachment portions CP of the main support portion 150 located at one end and the other end of the main support portion 150 in the first direction DR1. The core connection portions 310 may be connected to the attachment portions CP of the main support portion 150 so as to be rotatable in the third direction DR3, i.e., in the thickness direction. Thus, the main core portions 330 can be easily moved along the thickness direction.

The main core portions 330 of the rigid cores 300 may be disposed inside the first sub-pad portion 210 and the second sub-pad portion 230, respectively. Since the main core portions 330 are disposed inside the first sub-pad portion 210 and the second sub-pad portion 230, respectively, when the main pad portion 250 of the shape pad 200 is pressed as described later, core portions 330 may be moved in the thickness direction due to the constituent materials of the main pad portion 250 being moved to the adjacent sub-pad portions 210 and 230 upon pressing caused by upward motion of motor 400. Accordingly, the sub-pad portions 210 and 230 may be deformed more convexly toward one side and the other side in the first direction DR1, thereby further facilitating the bonding at the bending portion and the side portion of the target panel and the cover window.

The rigid cores 300 may be made of a material having a higher rigidity than the constituent material of the shape pad 200 so as to be movable inside the shape pad 200. That is, the main core portions 330 of the rigid cores 300 may include a metal material having a higher rigidity than the constituent materials of the sub-pad portions 210 and 230. For example, the rigid cores 300 may be formed to include at least one of aluminum and an alloy containing aluminum, but the exemplary embodiment is not limited thereto.

The vertical motor 400 may be disposed below the shape pad support 100. The vertical motor 400 may vertically move the shape pad support 100 and the shape pad 200 disposed thereabove to cause pressure that facilitates bonding of the cover window and the target panel.

Referring to FIG. 2, the main core portions 330 of the rigid cores 300 may be disposed inside the sub-pad portions 210 and 230 and may not be in direct contact with the surfaces of the sub-pad portions 210 and 230. That is, a first average width W1 from the main support portion 150 of the shape pad support 100 to each of the sub-support portions 110 and 130 may be greater than a second average width W2 from the core connection portion 310 to the end of the main core portion 330. Thus, it is possible to prevent a contact pressure between the cover window and the target panel from being abnormally increased as the main core portion 330 of the rigid core 300 comes into direct contact with the shape pad 200.

Hereinafter, a method for manufacturing a display device using the lamination apparatus 1 will be described. In the following exemplary embodiment, the same components as those of the above-described exemplary embodiment are denoted by the same reference numerals, and a description thereof will be omitted or simplified to avoid redundancy.

Figure 3:
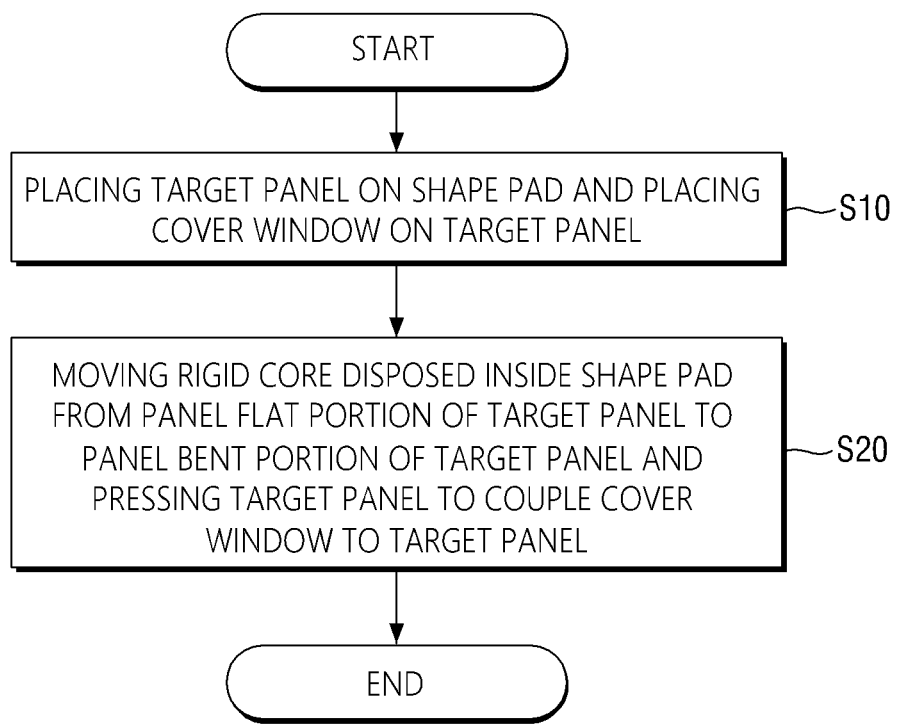
FIG. 3 is a flowchart of an exemplary embodiment of a method for manufacturing a display device according to the principles of the invention.
Figure 7:
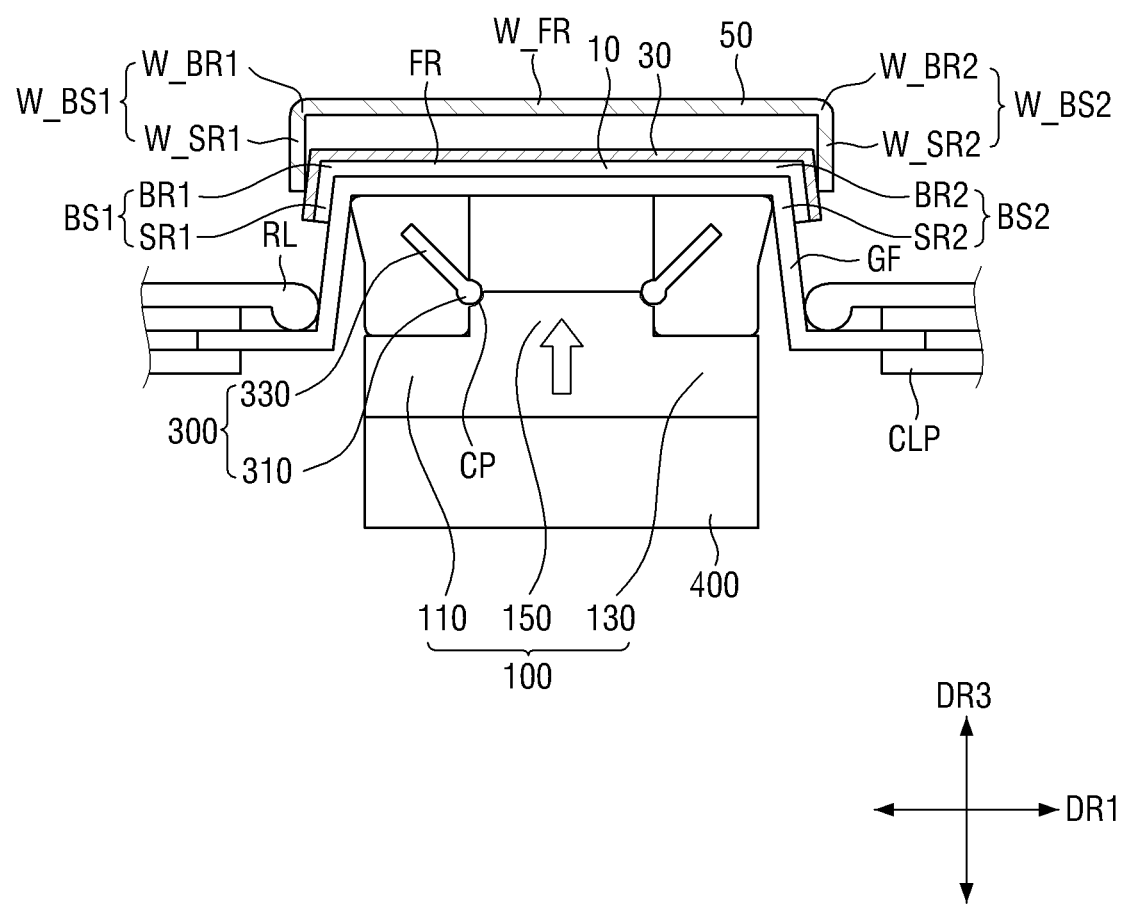
Figure 8:
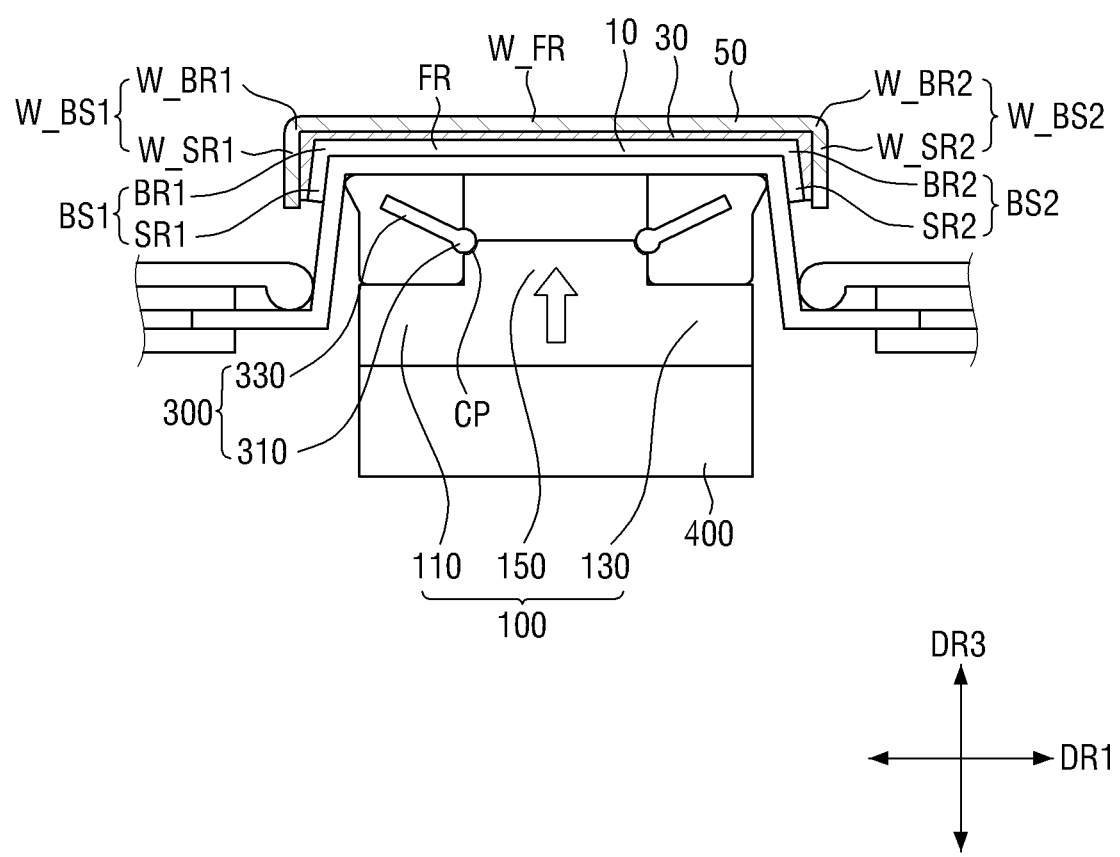
Figure 9:
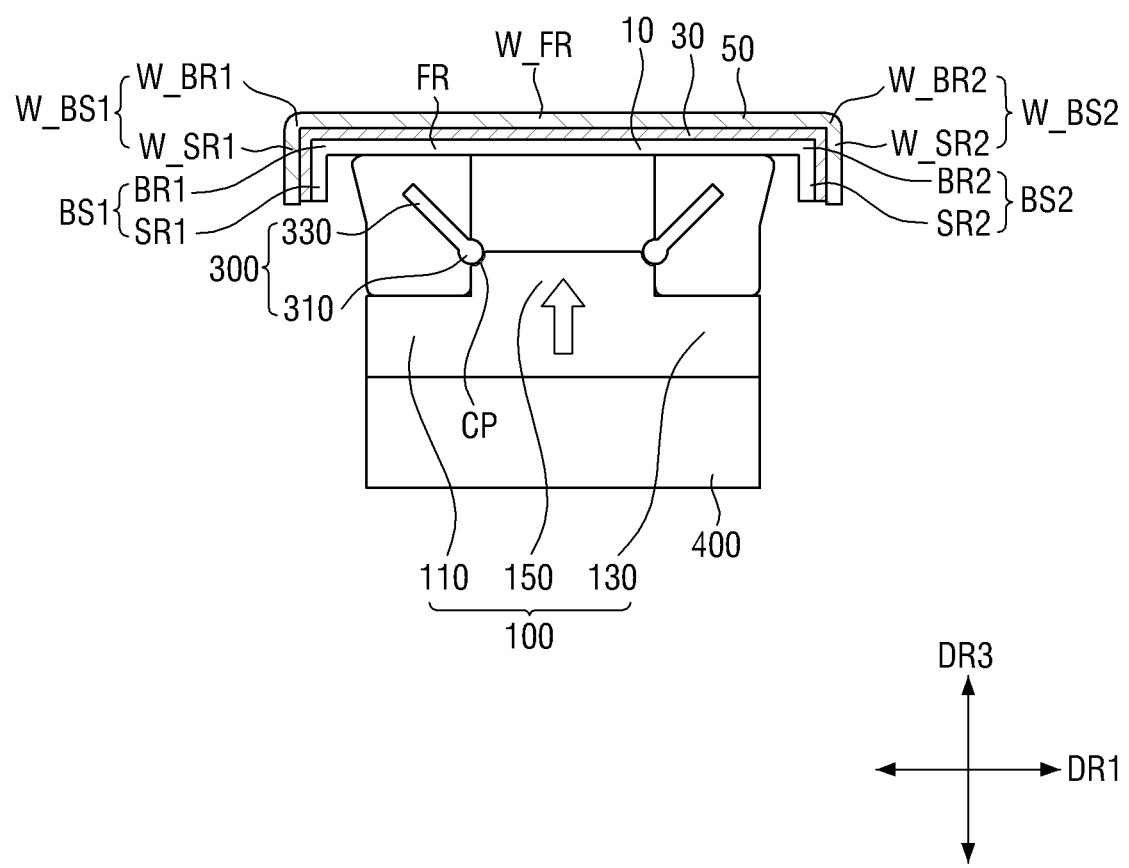
FIGS. 9 to 11 are cross-sectional views of an exemplary embodiment of the steps of a case where rigid cores are used to attach a curved portion and a side portion of the cover window and the target panel.
Figure 10:
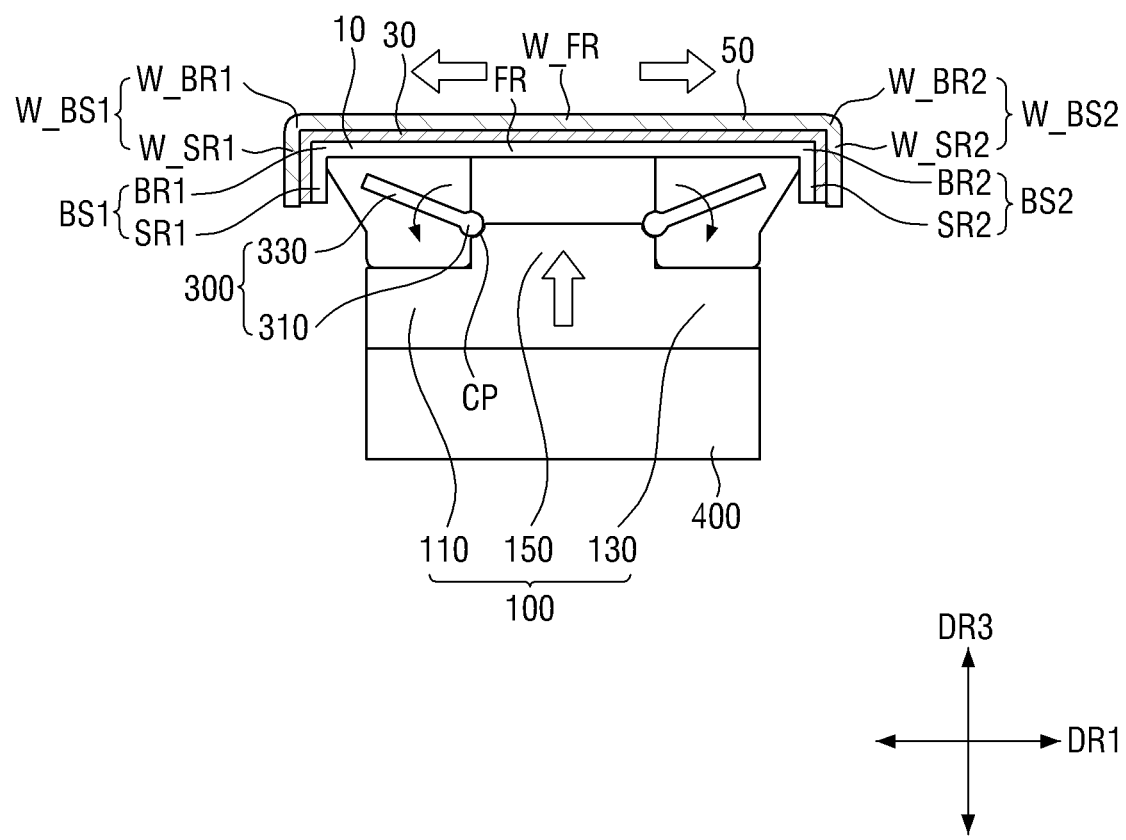
Figure 11:
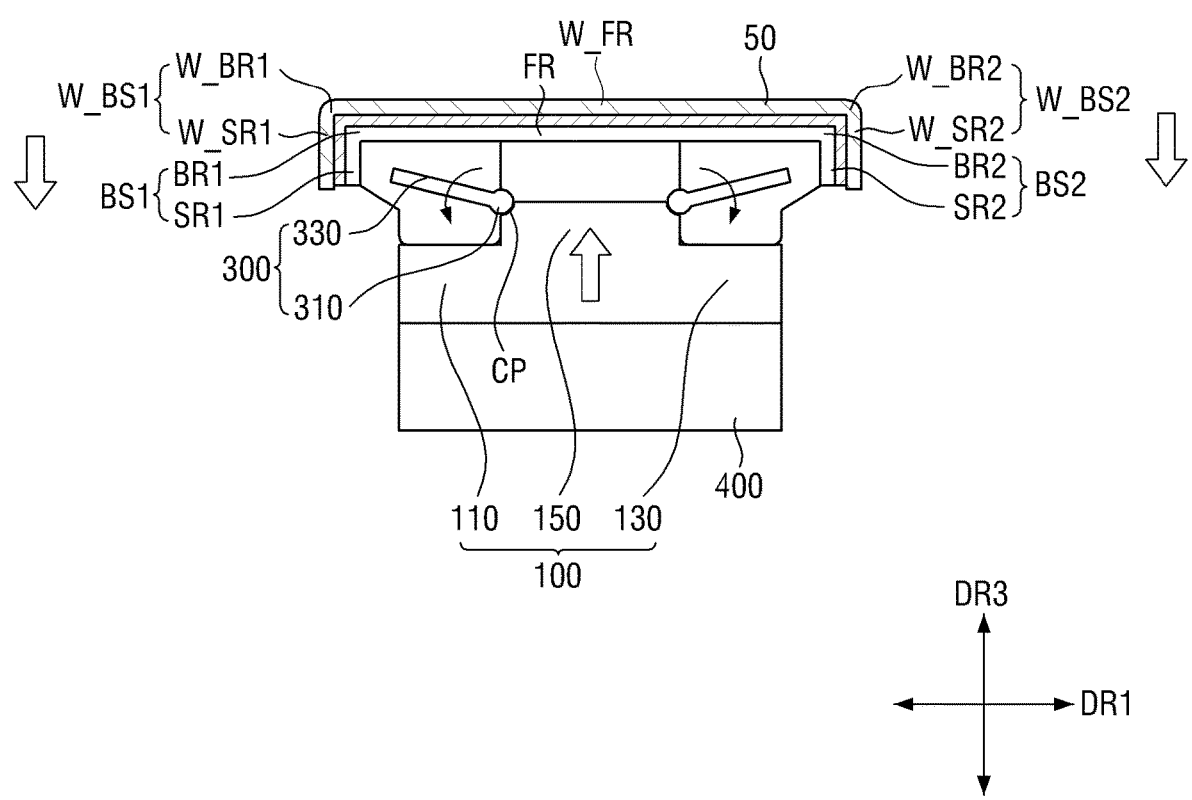

FIG. 3 is a flowchart of an exemplary embodiment of a method for manufacturing a display device according to the principles of the invention. FIGS. 4 to 8 are cross-sectional views of an exemplary embodiment of the steps of a method for manufacturing a display device according to the principles of the invention. FIGS. 9 to 11 are cross-sectional views of an exemplary embodiment of the steps of a case where the rigid cores are used to attach the curved and side portions of the cover window and the target panel.

Figure 4:
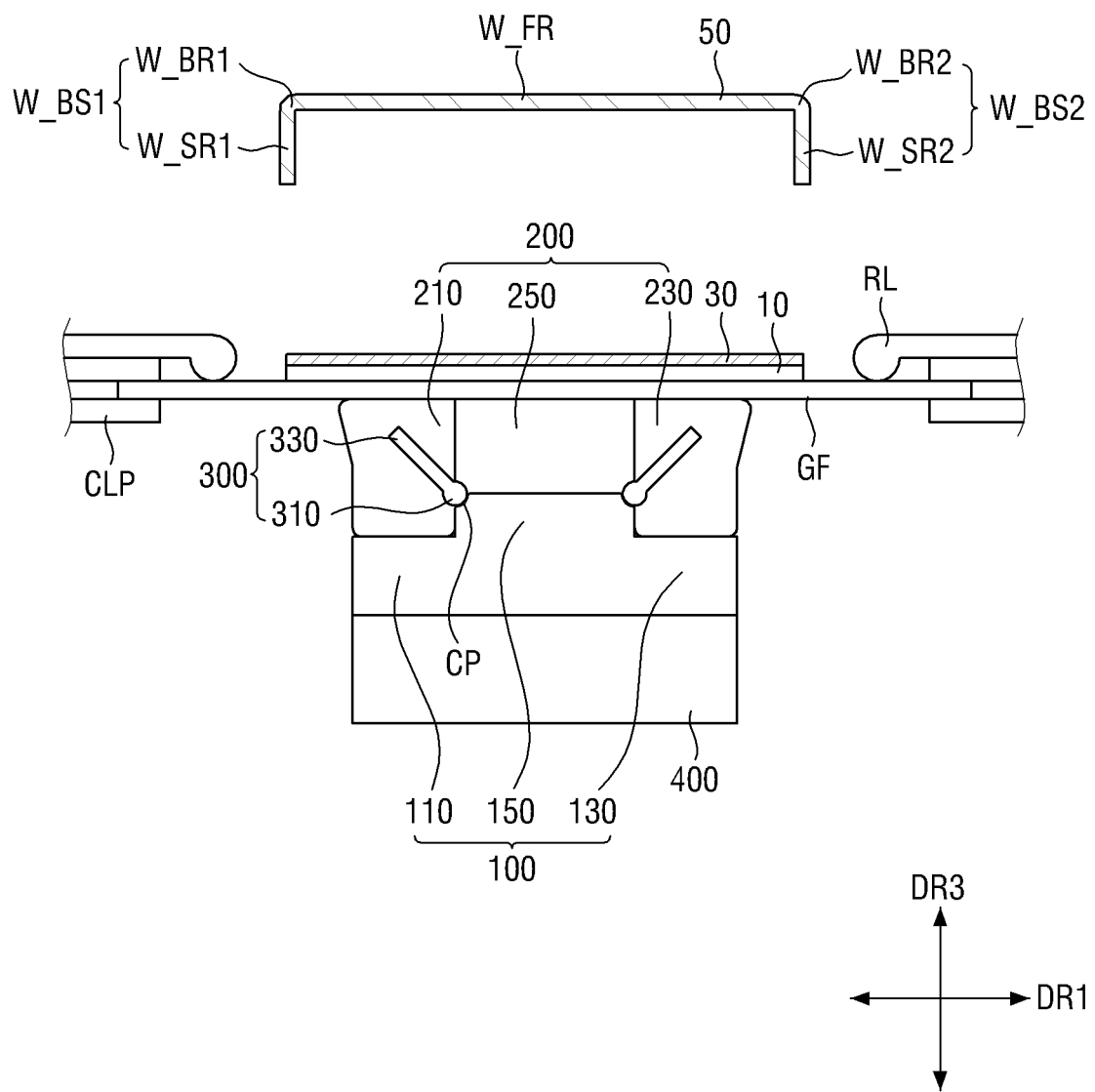
FIGS. 4 to 8 are cross-sectional views of an exemplary embodiment of the steps of a method for manufacturing a display device according to the principles of the invention.

Referring to FIGS. 3 and 4, a guide film GF is disposed on the shape pad 200, a target panel 10 is disposed on the guide film GF, an inter-module adhesive member 30 is disposed on the target panel 10, a cover window 50 is positioned separately above the inter-module adhesive member 30, clamps CLP are disposed at one end and the other end of the guide film GF in the first direction DR1 to simultaneously grip and fix one end portion and the other end portion of the guide film GF in the first direction DR1, and roller portions RL are disposed on the clamps CLP.

As shown in FIG. 4, the guide film GF may be extend outwardly further from the shape pad 200 on one side and on the other side in the first direction DR1 as shown in FIG. 4. The target panel 10 may be directly placed on a central portion of the guide film GF to be in contact therewith.

The target panel 10 is a panel for displaying an image by an input data signal. A panel such as an organic light emitting display panel, a liquid crystal display panel, a plasma display panel and an electrophoretic display panel may be used as the target panel 10. In the illustrated exemplary embodiment, an organic light emitting display panel is used as the target panel 10.

The target panel 10 may have a shape similar to the planar shape of the shape pad 200 described above with reference to FIG. 1. That is, the target panel 10 may have a rectangular shape including short side portions extending along the first direction DR1 and long side portions extending along the second direction DR2, or a rectangular shape including with rounded corners in plan view. However, the exemplary embodiment is not limited thereto and the planar shape of the target panel 10 may have various shapes.

The target panel 10 may include a display portion and a driving portion. The display portion may be disposed in a substantially central region of the target panel 10, and the driving portion may be disposed on the periphery on one side and/or the other side of the display portion of the target panel 10 in the first direction DR1.

The display portion includes a plurality of pixels. Each pixel may include a light emitting layer and a circuit layer for controlling the amount of light emitted from the light emitting layer. The circuit layer may include a display wiring, a display electrode and at least one transistor. The light emitting layer may include an organic light emitting material. The light emitting layer may be encapsulated by an encapsulation layer. The encapsulation layer may encapsulate the light emitting layer to prevent moisture and the like from infiltrating from the outside. The encapsulation layer may be a single or multilayer inorganic film, or a laminated film formed by alternately stacking inorganic and organic films.

The driving portion may be disposed on the periphery of the display portion, for example, on one side and/or the other side in the first direction DR1. The driving portion may be a non-display portion that does not display an image. Unlike the display portion, the driving portion may not include pixels. When the display portion has a rectangular shape with rounded corners, the driving portion is disposed adjacent to at least one side of the rectangular shape of the display portion. The driving portion may include a driving wiring connected to a display wiring of the pixel and a pad of the driving wiring. An external component, such as a driving chip or a printed circuit board, may be mounted on the driving wiring pad.

In one exemplary embodiment, the target panel 10 may include a flexible substrate. The flexible substrate may be formed to include, for example, a flexible plastic material such as polyimide. The target panel 10 may have flexibility. In other words, the target panel 10 may be formed of a material or structure that is bendable, foldable or rollable, so that the target panel 10 can be bent, folded or rolled.

The inter-module adhesive member 30 may be disposed on the target panel 10. The inter-module adhesive member 30 may be formed directly on the upper surface of the target panel 10. The planar shape of the inter-module adhesive member 30 may be substantially the same as or similar to the planar shape of the target panel 10. That is, the planar size of the inter-module adhesive member 30 may be substantially the same as the planar size of the target panel 10. The inter-module adhesive member 30 may be bent together with the target panel 10 when they are pressed into the cover window 50 as will be described later.

The inter-module adhesive member 30 may serve to attach the target panel 10 to the cover window 50. The inter-module adhesive member 30 may include a bonding layer, an adhesive layer, or a resin layer. For example, the inter-module adhesive member 30 may contain a polymer material classified as a silicone polymer, a urethane polymer, an SU polymer having a silicone-urethane hybrid structure, an acrylic polymer, an isocyanate polymer, a polyvinyl alcohol polymer, a gelatin polymer, a vinyl polymer, a latex polymer, a polyesther polymer, a water-based polyester polymer, and the like.

The cover window 50 may be positioned on the inter-module adhesive member 30. The cover window 50 may be fixed by a jig device although not shown. For example, the jig device may serve to fix the cover window 50 above the inter-module adhesive member 30 such that they are spaced apart from each other through a vacuum adsorption method or an adhesive method.

The cover window 50 may be made of transparent glass or plastic. That is, the cover window 50 may be formed of a light transmitting material.

The cover window 50 may have flexibility. In other words, the cover window 50 may be formed of a material or structure that is bendable, foldable or rollable, so that the cover window 50 can be bent, folded or rolled.

The cover window 50 may include a bottom surface facing the target panel 10, and a top surface which is opposite to the bottom surface.

The clamps CLP and the roller portions RL may be disposed, respectively, on one side and the other side of the guide film GF in the first direction DR1. The clamps CLP may serve to grip and fix the upper and lower surfaces of one end portion and the other end portion of the guide film GF in the first direction DR1. The roller portions RL may be disposed on the clamps CLP. The roller portion RL may include a tip portion which is in contact with the upper surface of the guide film GF as shown in FIG. 4. The roller portion RL may move toward the target panel 10 as described later, and may serve to bend the target panel 10 and the inter-module adhesive member 30. The roller portions RL may move together with the clamps CLP while being fixed on the clamps CLP.

Figure 5:
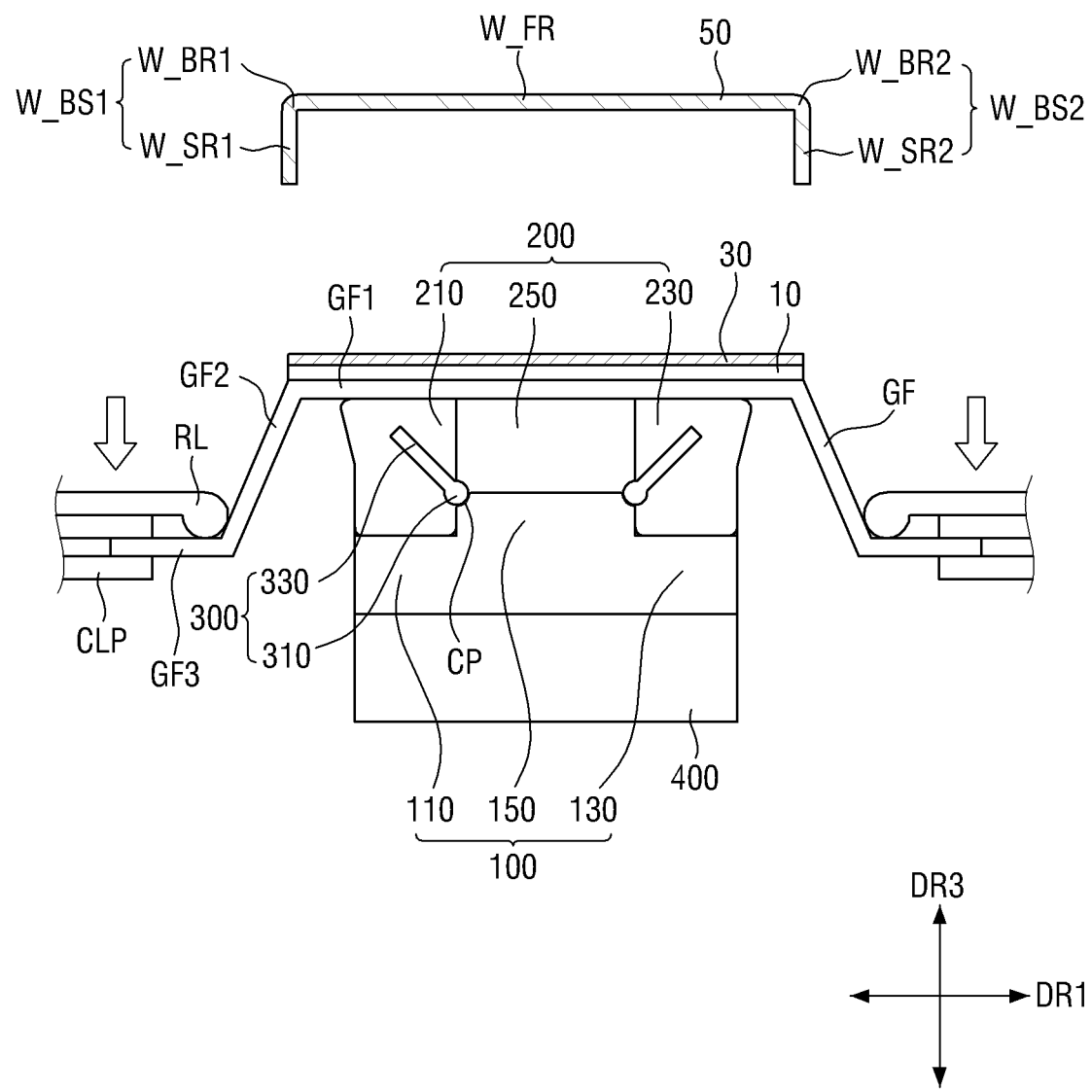

Then, referring to FIGS. 3 and 5, the clamps CLP and the roller portions RL are moved downward in the third direction DR3 to lower the opposite end portions of the guide film GF in the first direction DR1.

Accordingly, while the central regions overlapping the shape pad 200 of the guide film GF in the thickness direction are maintained in a flat state as they are, the peripheral regions not overlapping the shape pad 200 of the guide film GF may be bent downward to follow the lowering of the clamps CLP and the roller portions RL.

As shown in FIG. 5, the guide film GF may include a first flat portion GF1 overlapping the shape pad 200, a second flat portion GF2 overlapping the clamps CLP and the roller portions RL, and a guide connection portion GF3 disposed between the first flat portion GF1 and the second flat portion GF2 to connect them and inclined at a predetermined inclination. As shown in FIG. 5, the target panel 10 may overlap the first flat portion GF1 of the guide film GF, but may not to overlap the guide connection portion GF3 and the second flat portion GF2 of the guide film GF.

The flexible cover window 50 includes a plurality of regions. The cover window 50 may include a cover flat portion W_FR located in a central region, a first cover bent portion W-BS1 located on one side of the cover flat portion W_FR in the first direction DR1, and a second cover bent portion W-BS2 located on the other side of the cover flat portion W_FR in the first direction DR1. The first cover bent portion W-BS1 may include a first cover bending portion W_BR1 connected to the cover flat portion W_FR and bent in the thickness direction, and a first cover side portion W_SR1 connected to the first cover bending portion W_BR1 and located between the first cover bending portion W_BR1 and the one end portion of the cover window 50. The upper and lower surfaces of the first cover side portion W_SR1 may be oriented in the first direction DR1 as shown in FIG. 5, whereas the upper and lower surfaces of the cover flat portion W_FR may be oriented in the third direction DR3.

The cover window 50 may have an angle of 90 degrees or more between the upper and lower surfaces of the first cover side portion W_SR1 and the upper and lower surfaces of the cover flat portion W_FR. However, the exemplary embodiment is not limited thereto, and the angle between the upper and lower surfaces of the first cover side portion W_SR1 and the upper and lower surfaces of the cover flat portion W_FR may be an acute angle less than 90 degrees or an obtuse angle more than 90 degrees.

The second cover bent portion W-BS2 may have substantially the same configuration as the first cover bent portion W-BS1. That is, the second cover bent portion W-BS2 may include a second cover bending portion W_BR2 connected to the cover flat portion W_FR and bent in the thickness direction, and a second cover side portion W_SR2 connected to the second cover bending portion W_BR2 and located between the second cover bending portion W_BR2 and the other end portion of the cover window 50. The upper and lower surfaces of the second cover bending portion W_BR2 may be oriented in the first direction DR1 as shown in FIG. 5, whereas the upper and lower surfaces of the cover flat portion W_FR may be oriented in the third direction DR3.

The angle between the upper and lower surfaces of the second cover side portion W_SR2 and the upper and lower surfaces of the cover flat portion W_FR may be 90 degrees or more. However, the exemplary embodiment is not limited thereto, and the angle between the upper and lower surfaces of the second cover side portion W_SR2 and the upper and lower surfaces of the cover flat portion W_FR may be an acute angle less than 90 degrees or an obtuse angle more than 90 degrees.

Figure 6:
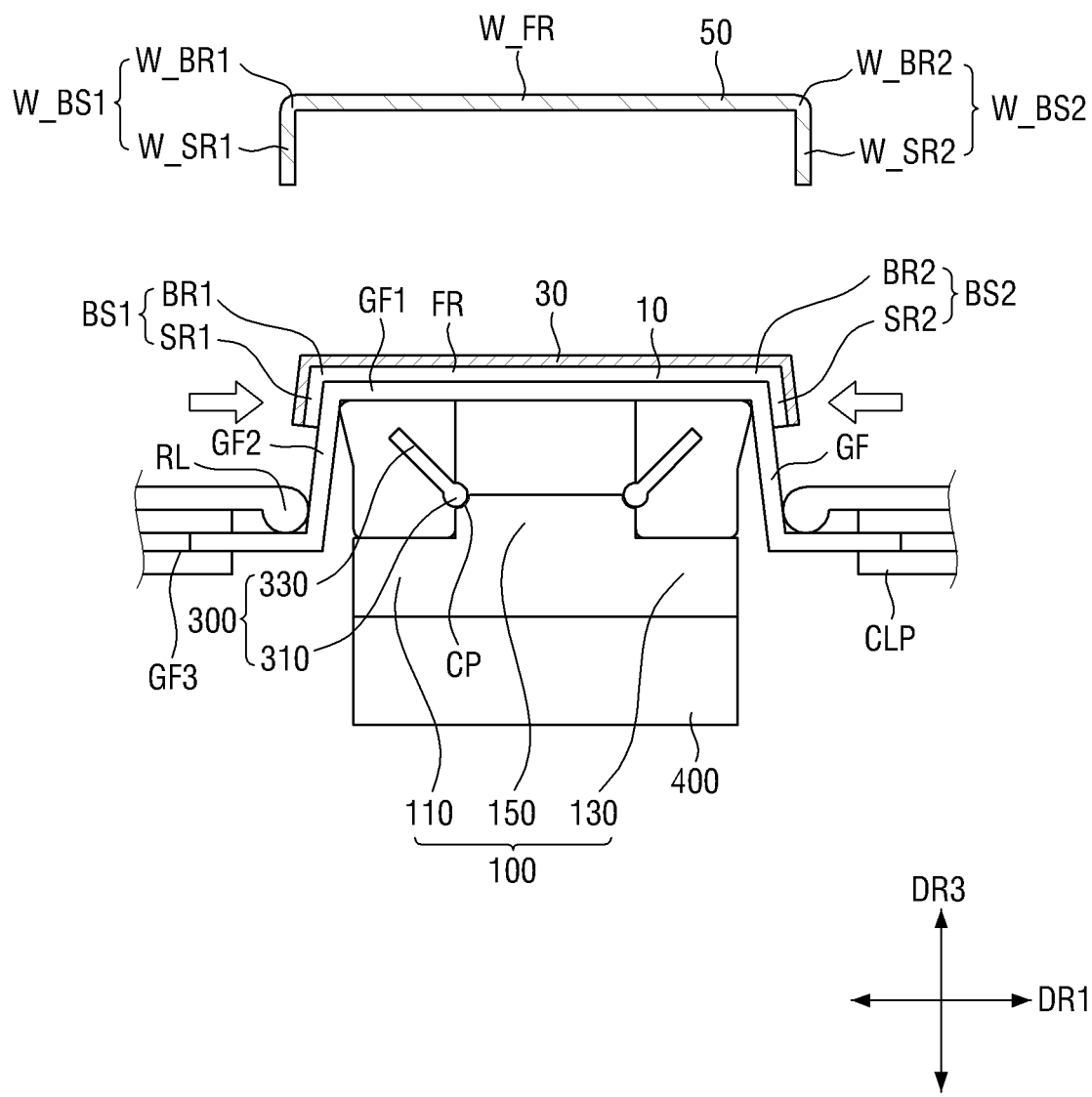

Referring to FIGS. 3 and 6, the roller portions RL are then moved toward the shape pad 200. That is, by moving the roller portions RL and the clamps CLP inwardly toward the shape pad 200, the inclination angle of the guide connection portion GF3 of the guide film GF may be increased. At the same time, the area of the first flat portion GF1 of the guide film GF may decrease and the area of the guide connection portion GF3 may increase. Accordingly, the target panel 10, which overlaps the first flat portion GF1 of the guide film GF, may also be disposed on the guide connection portion GF3 whose area has increased. That is, the target panel 10 may be substantially disposed on the first flat portion GF1 of the guide film GF, and may be partially disposed on the guide connection portion GF3 whose area has increased. The target panel 10 disposed on the guide connection portion GF3 may be bent along the thickness direction, for example, the third direction DR3.

Specifically, as shown in FIG. 6, the target panel 10 may include a flat portion FR and a bent portion BS1 and BS2 located around the flat portion FR. The bent portion BS1 and BS2 of the target panel 10 may be disposed adjacent to the long side portions of the shape pad 200. More specifically, the target panel 10 may include a panel flat portion FR located at the center, a first panel bent portion BS1 located at one side of the panel flat portion FR in the first direction DR1, and a second panel bent portion BS2 located on the other side of the panel flat portion FR in the first direction DR1.

The first panel bent portion BS1 may include a first panel bending portion BR1 connected to the panel flat portion FR and bent in the thickness direction, and a first panel side portion SR1 connected to the first panel bending portion BR1 and located between the first panel bending portion BR1 and one end portion of the target panel 10. The upper and lower surfaces of the first panel side portion SR1 may be oriented in the first direction DR1 as shown in FIG. 6, whereas the upper and lower surfaces of the panel flat portion FR may be oriented in the third direction DR3.

The target panel 10 may have an angle of 90 degrees or more between the upper and lower surfaces of the first panel side portion SR1 and the upper and lower surfaces of the panel flat portion FR. However, the exemplary embodiment is not limited thereto, and the angle between the upper and lower surfaces of the first panel side portion SR1 and the upper and lower surfaces of the panel flat portion FR may be an acute angle less than 90 degrees or an obtuse angle more than 90 degrees.

The second panel bent portion BS2 may have substantially the same configuration as the first panel bent portion BS1. That is, the second panel bent portion BS2 may include a second panel bending portion BR2 connected to the panel flat portion FR and bent in the thickness direction, and a second panel side portion SR2 connected to the second panel bending portion BR2 and located between the second panel bending portion BR2 and the other end portion of the target panel 10. The upper and lower surfaces of the second panel side portion SR2 may be oriented in the first direction DR1 as shown in FIG. 6, whereas the upper and lower surfaces of the panel flat portion FR may be oriented in the third direction DR3.

The angle between the upper and lower surfaces of the second panel side portion SR2 and the upper and lower surfaces of the panel flat portion FR may be 90 degrees or more. However, the exemplary embodiment is not limited thereto, and the angle between the upper and lower surfaces of the second panel side portion SR2 and the upper and lower surfaces of the panel flat portion FR may be an acute angle less than 90 degrees or an obtuse angle more than 90 degrees.

The inter-module adhesive member 30 disposed on the upper surface of the target panel 10 may be bent at one end and the other end together with the target panel 10 to follow the shapes of the flat portion FR and the bent portion BS1 and BS2 of the target panel 10. That is, the shape of the inter-module adhesive member 30 may be substantially the same as the shape of the target panel 10.

As shown in FIG. 6, the cover window 50 may have a size to externally cover the inter-module adhesive member 30 and the target panel 10 and described therebelow. That is, the first panel bent portion BS1, the second panel bent portion BS2 and the panel flat portion FR of the target panel 10 may be covered by the first cover bent portion W_BS1, the second cover bent portion W_BS2 and the cover flat portion W_FR of the cover window 50.

Subsequently, referring to FIGS. 7 and 8, the shape pad support 100, the shape pad 200, the guide film GF, the target panel 10, and the inter-module adhesive member 30 are raised toward the cover window 50.

When the shape pad support 100, the shape pad 200, the guide film GF, the target panel 10 and the inter-module adhesive member 30 are raised toward the cover window 50, as shown in FIG. 9, a portion of the inter-module adhesive member 30 overlapping the panel flat portion FR of the target panel 10 may be brought into contact with the cover flat portion W_FR of the cover window 50, and portions of the inter-module adhesive member 30 overlapping the first panel bent portion BS1 and the second panel bent portion BS2 of the target panel 10 may be brought into contact with the first cover bent portion W_BS1 and the second cover bent portion W_BS2 of the cover window 50, respectively.

As a result, the panel flat portion FR of the target panel 10, the first panel bent portion BS1 and the second panel bent portion BS2 may be bonded to the cover flat portion W_FR of the cover window 50, the first cover bent portion W_BS1 and the second cover bent portion W_BS2, respectively, through the inter-module adhesive member 30 disposed therebetween.

When the portion of the inter-module adhesive member 30 overlapping the panel flat portion FR of the target panel 10 is in contact with the cover flat portion W_FR in the thickness direction due to the vertical motor 400 which moves in the vertical direction, e.g., in the thickness direction, the materials of the shape pad 200 overlapping the panel flat portion FR of the target panel 10 and the cover flat portion W_FR of the cover window 50 may be moved to the periphery in the first direction DR1 by the fixed cover window 50. For example, the constituent materials of the main pad portion 250, the first sub-pad portion 210 and the second sub-pad portion 230 of the shape pad 200 overlapping the panel flat portion FR of the target panel 10 and the cover flat portion W_FR of the cover window 50 may move to the periphery of the shape pad 200 in the first direction DR1.

When the portion of the inter-module adhesive member 30 overlapping the panel flat portion FR of the target panel 10 contacts the cover flat portion W_FR in the thickness direction, a sufficient contact pressure may be generated between the panel flat portion FR of the target panel 10 and the cover flat portion W_FR of the cover window 50 to provide a sufficient bonding force.

A sufficient bonding force may not be generated between the first panel bent portion BS1 of the target panel 10 and the first cover bent portion W_BS1 of the cover window 50 and between the second panel bent portion BS2 and the second cover bent portion W_BS2. More specifically, as described above, since the vertical motor 400 moves the target panel 10 and the inter-module adhesive member 30 toward the cover window 50 in the thickness direction, the contact pressure between the first panel bent portion BS1 and the first cover bent portion W_BS1 and between the second panel bent portion BS2 and the second cover bent portion W_BS2 in the first direction DR1 may not be sufficient.

In addition, the constituent materials of the main pad portion 250, the first sub-pad portion 210 and the second sub-pad portion 230 of the shape pad 200 may be moved to the periphery of the shape pad 200 in the first direction DR1 and biased to a region adjacent to the first panel bent portion BS1 and the second panel bent portion BS2 of the target panel 10 of the sub-pad portions 210 and 230. Even if the contact pressure between the first panel bent portion BS1 and the first cover bent portion W_BS1 and between the second panel bent portion BS2 and the second cover bent portion W_BS2 is increased to some extent, the contact pressure therebetween may be insufficient to provide a sufficient bonding force.

In order to increase the contact pressure between the first panel bent portion BS1 and the first cover bent portion W_BS1 and between the second panel bent portion BS2 and the second cover bent portion W_BS2, it is necessary to vertically move the shape pad 200, the target panel 10, and the inter-module adhesive member 30 in a direction toward the cover window 50. In this case, the contact pressure between the panel flat portion FR of the target panel 10 and the cover flat portion W_FR of the cover window 50 is excessively large, and thus, the components (e.g., a plurality of conductive layers and insulating layers of the circuit layer) of the target panel 10 may be cracked due to the increased contact pressure and may be physically damaged to cause defects of the target panel 10.

However, the lamination apparatus 1 may be configured as described above to further include the rigid cores 300 which are bonded to the shape pad support 100 of the lamination apparatus 1 and sequentially moved from the panel flat portion FR of the target panel 10 to the first panel bent portion BS1 inside the shape pad 200. Accordingly, even if the shape pad 200, the target panel 10 and the inter-module adhesive member 30 are not vertically moved in the direction toward the cover window 50, it is possible to increase the contact pressure between the first panel bent portion BS1 and the first cover bent portion W_BS1 and between the second panel bent portion BS2 and the second cover bent portion W_BS2.

In this case, the core connection portions 310 serve as a rotation axis of the main core portions 330, and the rigid cores 300 disposed inside the shape pad 200 are moved from the panel flat portion FR of the target panel 10 to the first and second panel bent portions BS1 and BS2 of the target panel 10 to press the target panel 10. Thus, the step of bonding the cover window 50 to the target panel 10 may further include moving the main core portions 330 from the panel flat portion FR to the first and second panel bent portions BS1 and BS2 with the core connection portions 310 as a rotation axis.

Referring to FIGS. 3 and 9, when the shape pad 200, the target panel 10 and the inter-module adhesive member 30 are moved toward the cover window 50 by the vertical motor 400, as described above, the materials of the shape pad 200 overlapping the panel flat portion FR of the target panel 10 and the cover flat portion W_FR of the cover window 50 are moved to the periphery in the first direction DR1, and at the same time, a contact pressure is generated between the panel flat portion FR of the target panel 10 and the cover flat portion W_FR of the cover window 50, so that the panel flat portion FR and the cover flat portion W_FR can be bondd to each other by the inter-module adhesive member 30.

Subsequently, referring to FIGS. 3 and 10, similarly to the case of FIG. 9, the shape pad 200, the target panel 10 and the inter-module adhesive member 30 are further moved vertically in the direction toward the cover window 50. At the same time, the main core portions 330 of the rigid cores 300 move in the thickness direction, e.g., the third direction DR3, due to the materials of the shape pad 200 overlapping the panel flat portion FR moved to the periphery in the first direction DR1. That is, the main core portions 330 may move from the panel flat portion FR to the first and second panel bent portions BS1 and BS2 of the target panel 10. Specifically, the main core portions 330 may sequentially move from the panel flat portion FR to the first panel bending portion BR1 and the first panel side portion SR1 of the first panel bent portion. Similarly, the main core portions 330 may sequentially move from the panel flat portion FR to the second panel bending portion BR2 and the second panel side portion SR2 of the second panel bent portion.

Accordingly, as shown in FIG. 10, the moved materials of the shape pad 200 may expand the first sub-pad portion 210 adjacent to the first panel bending portion BR1 of the first panel bent portion BS1 of the target panel 10 to increase the contact pressure between the first panel bending portion BR1 and the first cover bending portion W_BR1. Thus, the bonding force between the first panel bending portion BR1 and the first cover bending portion W_BR1 can be increased.

Similarly, the moved materials of the shape pad 200 may expand the second sub-pad portion 230 adjacent to the second panel bending portion BR2 of the second panel bent portion BS2 of the target panel 10 to increase the contact pressure between the second panel bending portion BR2 and the second cover bending portion W_BR2. Thus, the bonding force between the second panel bending portion BR2 and the second cover bending portion W_BR2 can be increased.

Subsequently, referring to FIGS. 3 and 11, similarly to the case of FIG. 9, the shape pad 200, the target panel 10 and the inter-module adhesive member 30 are further moved vertically in the direction toward the cover window 50. At the same time, the main core portions 330 of the rigid cores 300 move in the thickness direction, e.g., the third direction DR3, due to the materials of the shape pad 200 overlapping the panel flat portion FR moved to the periphery in the first direction DR1. Accordingly, as shown in FIG. 11, the moved materials of the shape pad 200 may expand the first sub-pad portion 210 adjacent to the first panel side portion SR1 of the first panel bent portion BS1 of the target panel 10 to increase the contact pressure between the first panel side portion SR1 and the first cover side portion W_SR1. Thus, the bonding force between the first panel side portion SR1 and the first cover side portion W_SR1 can be increased.

Similarly, the moved materials of the shape pad 200 may expand the second sub-pad portion 230 adjacent to the second panel side portion SR2 of the second panel bent portion BS2 of the target panel 10 to increase the contact pressure between the second panel side portion SR2 and the second cover side portion W_SR2. Thus, the bonding force between the second panel side portion SR2 and the second cover side portion W_SR2 can be increased.

Figure 12:
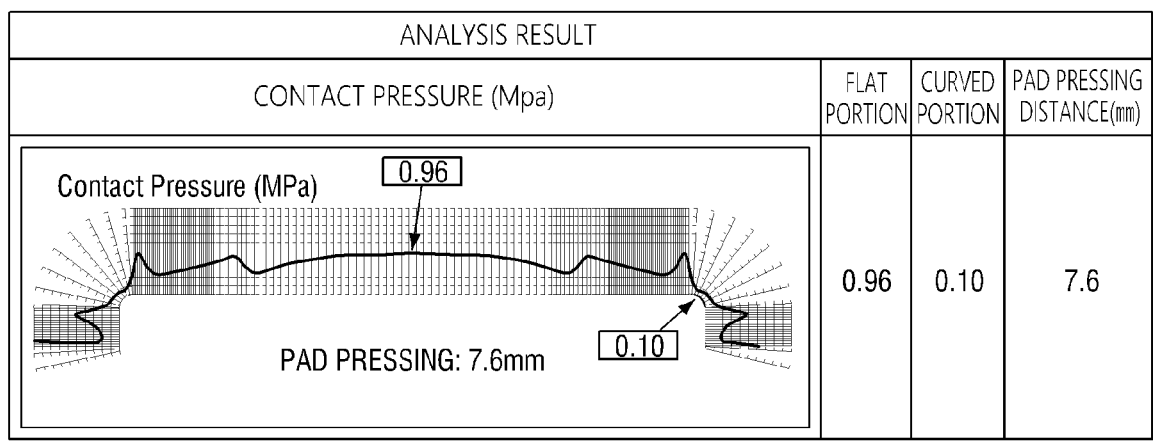
FIG. 12 shows exemplary embodiments of the contact pressure of the target panel and the cover window according to whether or not the rigid cores are included.
Figure 12:
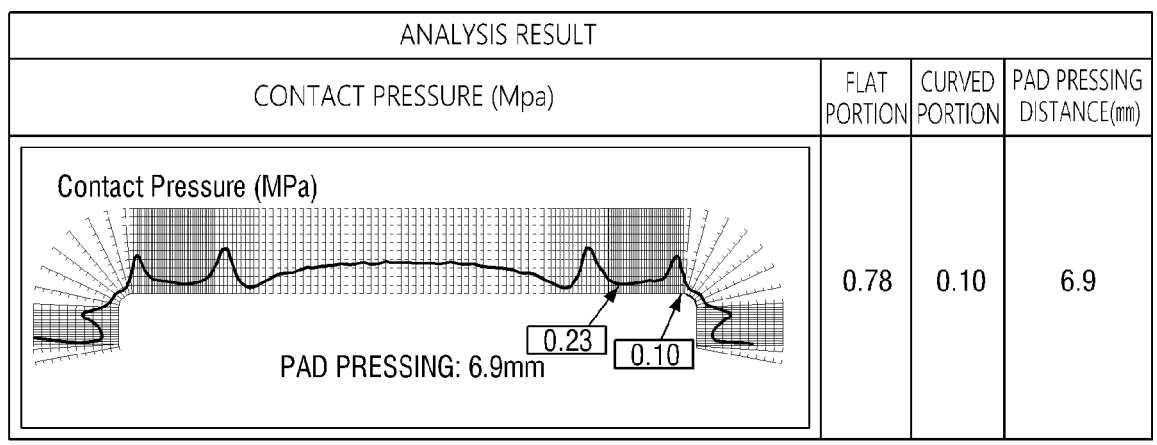

FIG. 12 shows exemplary embodiments of the contact pressure of the target panel and the cover window according to whether or not the rigid cores are included. In FIG. 12, (a) and (b) show vertical movement distances of the shape pad 200 for applying the same contact pressure between the first and second panel bent portions BS1 and BS2 of the target panel 10 and the first and second cover bent portions W_BS1 and W_BS2 of the cover window 50 depending on whether the lamination apparatus 1 includes the rigid cores 300.

More specifically, in an exemplary embodiment without the rigid cores 300, as shown in (a) of FIG. 12, the pressing distance, i.e., the vertical movement distance, of the shape pad 200 for applying a contact pressure of 0.1 MPa between the first and second panel bent portions BS1 and BS2 of the target panel 10 and the first and second cover bent portions W_BS1 and W_BS2 of the cover window 50 is about 7.6 mm. As a result, it can be seen that the contact pressure between the panel flat portion FR and the cover flat portion W_FR is 0.96 Mpa. In the exemplary embodiment including the rigid cores 300, as shown in (b) of FIG. 12, the pressing distance, i.e., the vertical movement distance, of the shape pad 200 for applying a contact pressure of 0.1 MPa between the first and second panel bent portions BS1 and BS2 of the target panel 10 and the first and second cover bent portions W_BS1 and W_BS2 of the cover window 50 is about 6.9 mm. As a result, it can be seen that the contact pressure between the panel flat portion FR and the cover flat portion W_FR is 0.78 Mpa.

That is, since the rigid cores 300 can reduce the pad pressing distance and also reduce the contact pressure between the plat portions, the lamination apparatus 1 including the rigid cores 300 disposed inside the first sub-pad portion 210 and the second sub-pad portion 230, respectively, may further facilitate the bonding between the target panel 10 and the cover window 50 in a bending region of the target panel 10 and the cover window 50 and a side region connected thereto.

Further, it is possible to reduce the contact pressure between the panel flat portion FR and the cover flat portion W_FR by reducing the pressing distance, i.e., the vertical movement distance, of the shape pad 200 for applying the same contact pressure between the first and second panel bent portions of the target panel 10 and the first and second cover bent portions of the cover window 50. Accordingly, it is possible to prevent a phenomenon in which the contact pressure between the panel flat portion FR of the target panel 10 and the cover flat portion W_FR of the cover window 50 becomes excessively large and the components (e.g., a plurality of conductive layers and insulating layers of the circuit layer) of the target panel 10 are cracked due to the increased contact pressure and physically damaged, thereby preventing defects of the target panel 10.

Hereinafter, a lamination apparatus according another exemplary embodiment will be described. In the following exemplary embodiment, the same components as those of the above-described exemplary embodiment are denoted by the same reference numerals, and a description thereof will be omitted or simplified.

Figure 13A:
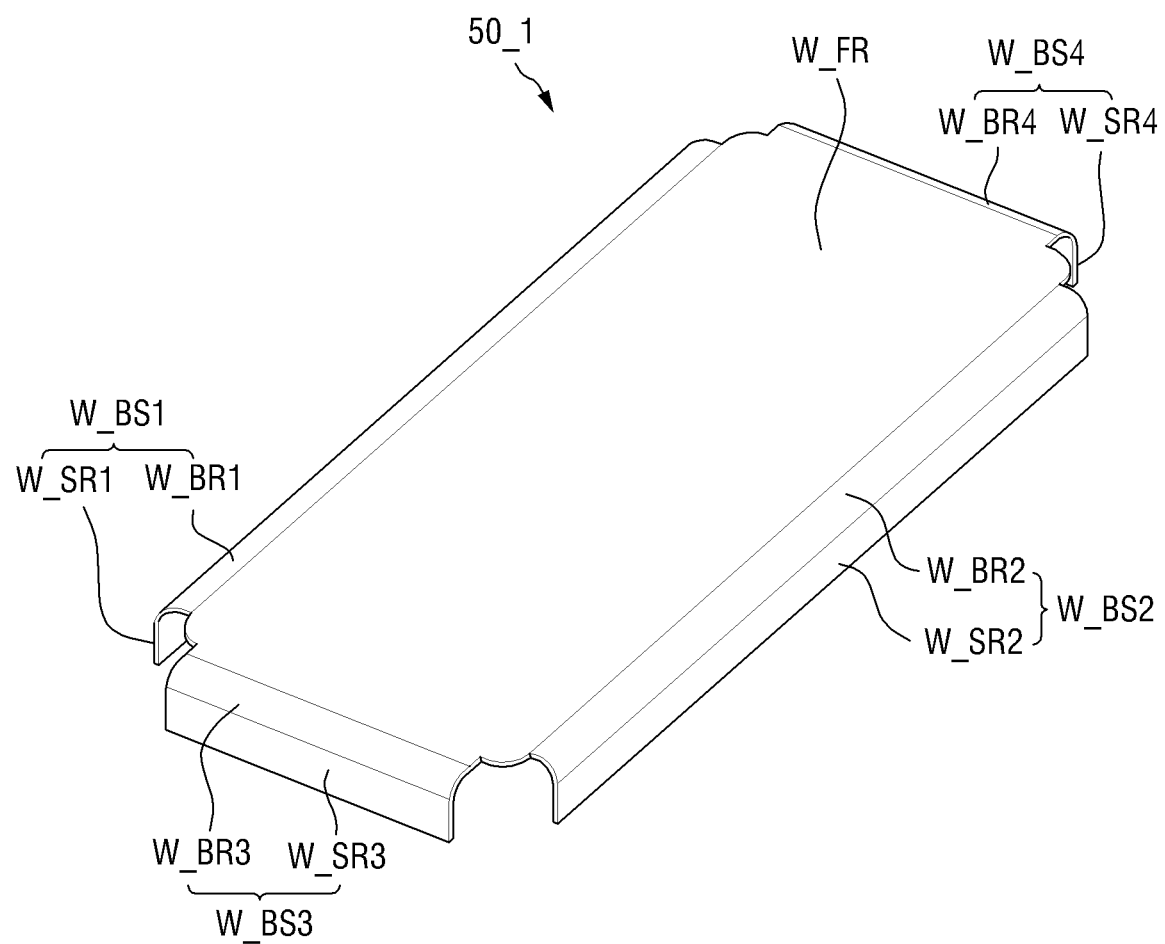
FIG. 13A is a perspective view of another exemplary embodiment of a cover window.
Figure 13B:
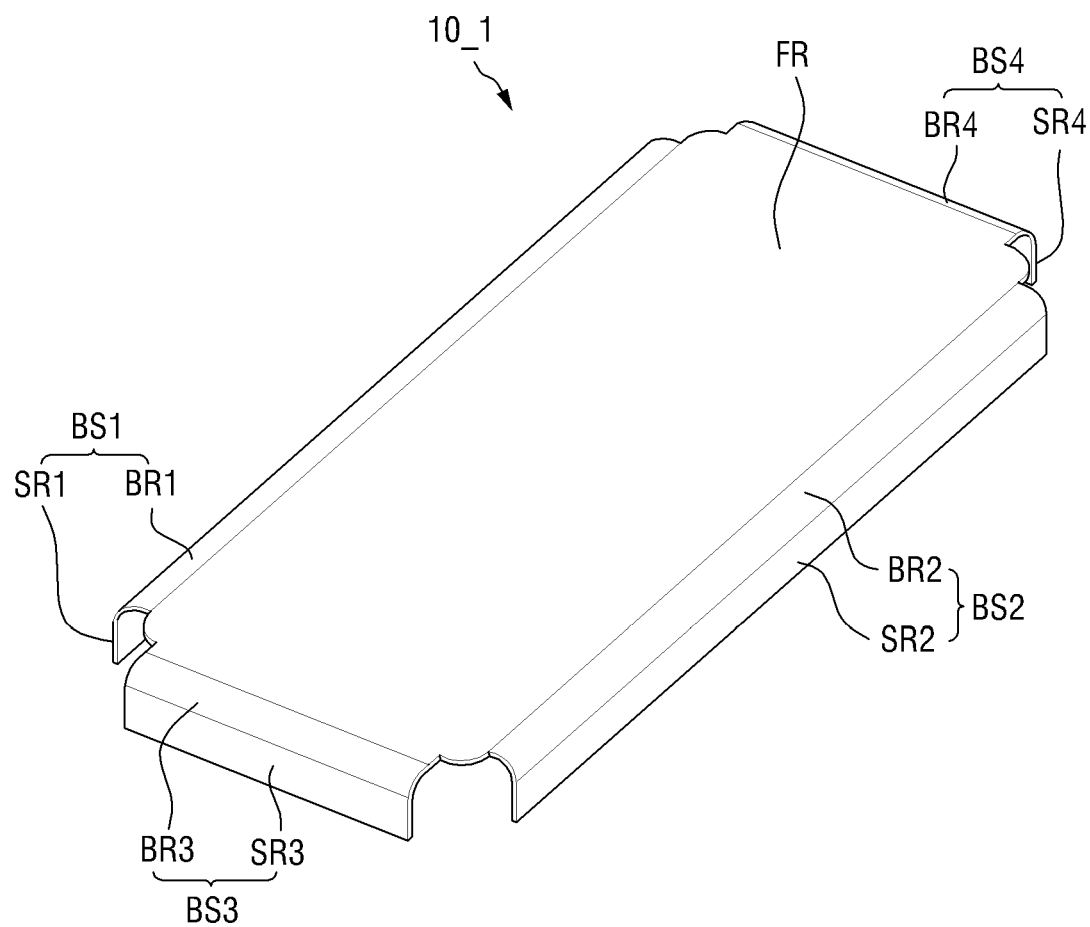
FIG. 13B is a perspective view of another exemplary embodiment of a target panel.
Figure 14:
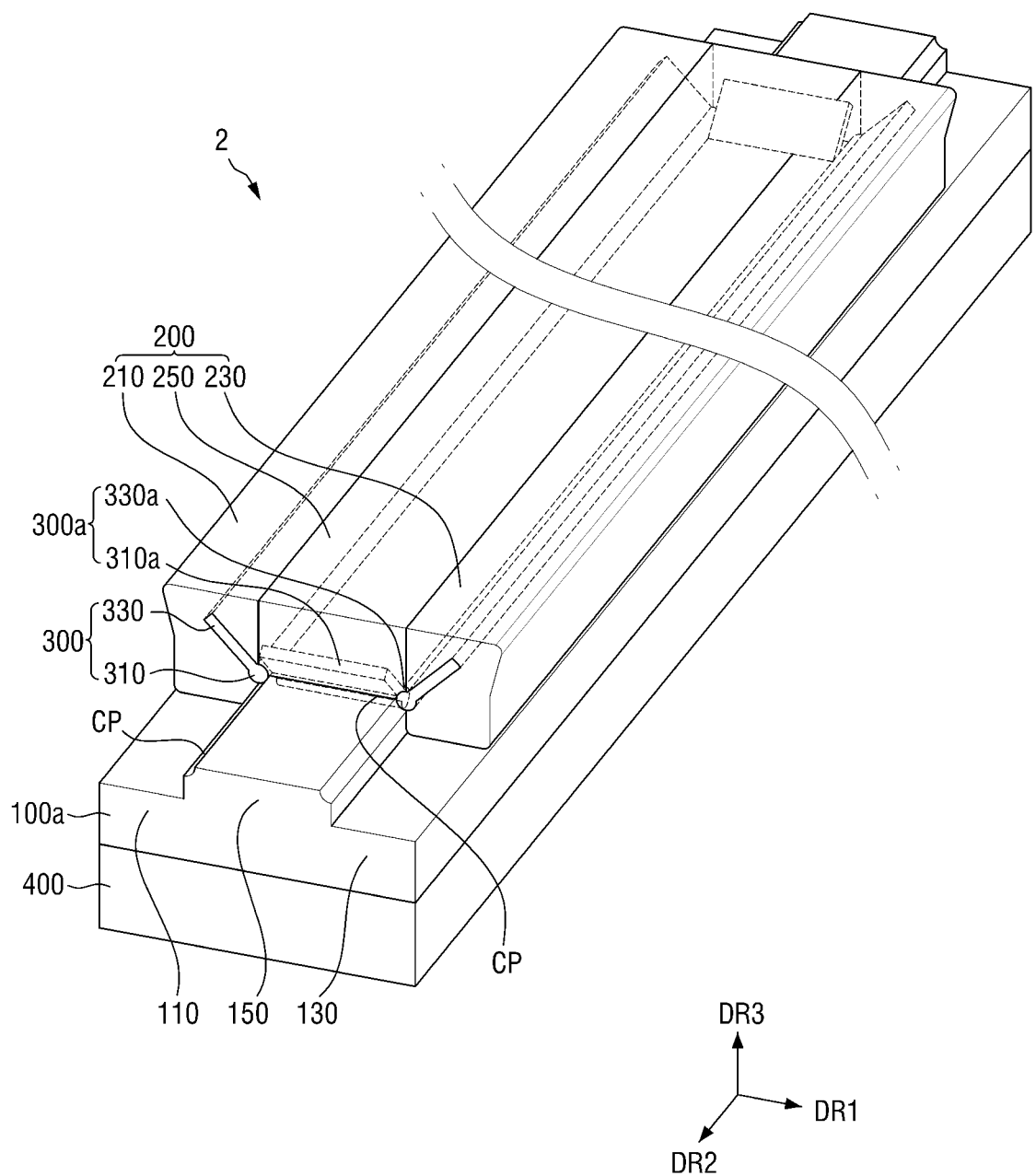
FIG. 14 is a perspective view of another exemplary embodiment of a lamination apparatus constructed according to the principles of the invention.

FIG. 13A is a perspective view of another exemplary embodiment of a cover window, and FIG. 13B is a perspective view of another exemplary embodiment of a target panel. FIG. 14 is a perspective view of another exemplary embodiment of a lamination apparatus constructed according to the principles of the invention.

Referring to FIGS. 13 and 14, a cover window 50_1 is different from the cover window 50 according to the above-described exemplary embodiment in that bent portions are formed in the short side portions. Further, a lamination apparatus 2 is different from the lamination apparatus 1 according to the above-described exemplary embodiment in that the rigid cores 300 are further disposed on the short side portions of the shape pad.

More specifically, as shown in FIG. 13, in the cover window 50_1, the short side portions may also have bent portions, unlike the cover window 50. That is, the cover window 50_1 may have a third cover bent portion W_BS3 and a fourth cover bent portion W_BS4, which are formed in the short side portions, respectively.

The third cover bent portion W_BS3 may include a third cover bending portion W_BR3 adjacent to the cover flat portion W_FR, and a third cover side portion W SR3 spaced apart from the cover flat portion W_FR with the third cover bending portion W_BR3 interposed therebetween. The fourth cover bent portion W_BS4 may include a fourth cover bending portion W_BR4 adjacent to the cover flat portion W_FR, and a fourth cover side portion W SR4 spaced apart from the cover flat portion W_FR with the fourth cover bending portion W_BR4 interposed therebetween. The third cover bent portion W_BS3 and the fourth cover bent portion W_BS4 have substantially the same shapes as the first cover bent portion and the second cover bent portion described with reference to FIG. 5 except that they are disposed on the short side portions of the cover window 50_1, and thus, a redundant description will be omitted.

As shown in FIG. 14, in the lamination apparatus 2, second rigid cores 300a may be further disposed at the short side portions of the shape pad. That is, a shape pad support 100a of the laminating apparatus 2 may further include attachment portions CP at the short side portions extending along the first direction DR1. The second rigid cores 300a may be further connected to the attachment portions CP at the short side portions extending along the first direction DR1. The attachment portions CP at the short side portions may be located, respectively, at one end of the main support portion 150 in the second direction DR2 and at the other end of the main support portion 150 in the second direction DR2. The attachment portions CP at the short side portions may be formed to extend along the first direction DR1.

Each of the second rigid cores 300a may be disposed inside the shape pad 200.

Referring to FIG. 13B, the cover panel 50_1 is bonded with a target panel 10_1 having four bent portions by using the lamination apparatus 2.

That is, the target panel 10_1 may further include not only the first panel bent portion BS1 and the second panel bent portion BS2, but also a third panel bent portion BS3 and a fourth panel bent portion BS4 disposed on the short side portions of the target panel 10_1. The third panel bent portion BS3 may include a third panel bending portion BR3 adjacent to the panel flat portion FR, and a third panel side portion SR3 spaced apart from the panel flat portion FR with the third panel bending portion BR3 interposed therebetween. The fourth panel bent portion BS4 may include a fourth panel bending portion BR4 adjacent to the panel flat portion FR, and a fourth panel side portion SR4 spaced apart from the panel flat portion FR with the fourth panel bending portion BR4 interposed therebetween.

The inter-module adhesive member 30 disposed on the upper surface of the target panel may be bent at its distal ends together with the target panel to follow the shapes of the flat portion FR and the bent portion BS1, BS2, BS3, and BS4 of the target panel 10_1. That is, the shape of the inter-module adhesive member 30 may be substantially the same as the shape of the target panel.

The shape pad support 100a, the shape pad 200, the guide film GF shown in FIGS. 4 to 8, the target panel 10_1 and the inter-module adhesive member 30 are raised toward the cover window 50_1. That is, when the shape pad support 100a, the shape pad 200, the guide film GF, the target panel and the inter-module adhesive member 30 are raised toward the cover window 50_1, a portion of the inter-module adhesive member 30 overlapping the panel flat portion FR of the target panel may be brought into contact with the cover flat portion W_FR of the cover window 50_1, and portions of the inter-module adhesive member 30 overlapping the first to fourth panel bent portions BS1, BS2, BS3, and BS4 of the target panel 10_1 may be brought into contact with the first to fourth cover bent portions of the cover window 50_1, respectively.

As a result, the panel flat portion FR of the target panel 10, the first panel bent portion BS1, the second panel bent portion BS2, the third panel bent portion BS3 and the fourth panel bent portion BS4 may be bonded to the cover flat portion W_FR of the cover window 50_1, the first cover bent portion W_BS1, the second cover bent portion W_BS2, the third cover bent portion W_BS3 and the fourth cover bent portion W_BS4, respectively, through the inter-module adhesive member 30 disposed therebetween.

When the portion of the inter-module adhesive member 30 overlapping the panel flat portion FR of the target panel contacts the cover flat portion W_FR in the thickness direction due to the vertical motor 400 moving in the vertical direction, e.g., in the thickness direction, the materials of the shape pad 200 overlapping the panel flat portion FR of the target panel and the cover flat portion W_FR of the cover window 50_1 may be moved to the periphery in the first direction DR1 and the second direction DR2 by the fixed cover window 50_1. For example, the constituent materials of the main pad portion 250, the first sub-pad portion 210 and the second sub-pad portion 230 of the shape pad 200 overlapping the panel flat portion FR of the target panel and the cover flat portion W_FR of the cover window 50_1 may move to the periphery of the shape pad 200 in the first direction DR1 and the second direction DR2.

As described above, a sufficient bonding force may not be obtained between the first panel bent portion BS1 of the target panel 10_1 and the first cover bent portion W_BS1 of the cover window 50_1 and between the second panel bent portion BS2 and the second cover bent portion W_BS2. Similarly, a sufficient bonding force may not be obtained between the third panel bent portion BS3 and the third cover bent portion W_BS3 of the cover window 50_1 and between the fourth panel bent portion BS4 and the fourth cover bent portion W_BS4.

However, the lamination apparatus 2 may be configured as described above to further include the second rigid cores 300a which are bonded to the shape pad support 100a of the lamination apparatus 2 and sequentially moved from the panel flat portion FR of the target panel to each adjacent panel bent portion inside the shape pad 200. Accordingly, even if the shape pad 200, the target panel and the inter-module adhesive member 30 are not vertically moved in the direction toward the cover window 50, it is possible to increase the contact pressure between the first panel bent portion BS1 and the first cover bent portion W_BS1, between the second panel bent portion BS2 and the second cover bent portion W_BS2, between the third panel bent portion BS3 and the third cover bent portion W_BS3, and between the fourth panel bent portion BS4 and the fourth cover bent portion W_BS4.

As explained above in FIGS. 7 and 8, when the shape pad 200, the target panel and the inter-module adhesive member 30 are moved toward the cover window 50_1 by the vertical motor 400, as described above, the materials of the shape pad 200 overlapping the panel flat portion FR of the target panel and the cover flat portion W_FR of the cover window 50_1 are moved to the periphery in the first direction DR1 and the second direction DR2, and at the same time, contact pressure is generated between the panel flat portion FR of the target panel and the cover flat portion W_FR of the cover window 50_1, so that the panel flat portion FR and the cover flat portion W_FR can be bonded to each other by the inter-module adhesive member 30.

Subsequently, as explained above in FIGS. 9 to 11 while the shape pad 200, the target panel, and the inter-module adhesive member 30 are further moved vertically in the direction toward the cover window 50_1, main core portions 330a of the second rigid cores 300a move in the thickness direction, e.g., the third direction DR3, due to the materials of the shape pad 200 overlapping the panel flat portion FR moved to the periphery in the first direction DR1 and the second direction DR2. That is, the main core portions 330a may move from the panel flat portion FR to the first to fourth panel bent portions BS1, BS2, BS3, and BS4 of the target panel 10_1. Specifically, the main core portions 330a may sequentially move from the panel flat portion FR to the first panel bending portion BR1 of the first panel bent portion BS1 and the first panel side portion SR1, similarly, sequentially move from the panel flat portion FR to the second panel bending portion BR2 of the second panel bent portion BS2 and the second panel side portion SR2, sequentially move from the panel flat portion FR to the third panel bending portion BR3 of the third panel bent portion BS3 and the third panel side portion SR3, and sequentially move from the panel flat portion FR to the fourth panel bending portion BR4 of the fourth panel bent portion BS4 and the fourth panel side portion SR4.

Accordingly, the moved materials of the shape pad 200 may expand the first sub-pad portion 210 adjacent to the first panel bending portion BR1 of the first panel bent portion BS1 of the target panel to increase the contact pressure between the first panel bending portion BR1 and the first cover bending portion W_BR1. Thus, the bonding force between the first panel bending portion BR1 and the first cover bending portion W_BR1 can be increased.

Similarly, the moved materials of the shape pad 200 may expand the second sub-pad portion 230 adjacent to the second panel bending portion BR2 of the second panel bent portion BS2 of the target panel to increase the contact pressure between the second panel bending portion BR2 and the second cover bending portion W_BR2. Thus, the bonding force between the second panel bending portion BR2 and the second cover bending portion W_BR2 can be increased.

Further, the moved materials of the shape pad 200 may expand the sub-pad portion adjacent to the third panel bending portion BR3 of the third panel bent portion BS3 of the target panel to increase the contact pressure between the third panel bending portion BR3 and the third cover bending portion W_BR3. Thus, the bonding force between the third panel bending portion BR3 and the third cover bending portion W_BR3 can be increased.

Further, the moved materials of the shape pad 200 may expand the sub-pad portion adjacent to the fourth panel bending portion BR4 of the fourth panel bent portion BS4 of the target panel to increase the contact pressure between the fourth panel bending portion BR4 and the fourth cover bending portion W_BR4. Thus, the bonding force between the fourth panel bending portion BR4 and the fourth cover bending portion W_BR4 can be increased.

Subsequently, while the shape pad 200, the target panel, and the inter-module adhesive member 30 are further moved vertically in the direction toward the cover window 50_1, the main core portions 330a of the rigid cores 300a move in the thickness direction, e.g., the third direction DR3, due to the materials of the shape pad 200 overlapping the panel flat portion FR being moved to the periphery in the first direction DR1. Accordingly, the moved materials of the shape pad 200 may expand the first sub-pad portion 210 adjacent to the first panel side portion SR1 of the first panel bent portion of the target panel to increase the contact pressure between the first panel side portion SR1 and the first cover side portion W_SR1. Thus, the bonding force between the first panel side portion SR1 and the first cover side portion W_SR1 can be increased.

Similarly, the moved materials of the shape pad 200 may expand the second sub-pad portion 230 adjacent to the second panel side portion SR2 of the second panel bent portion of the target panel to increase the contact pressure between the second panel side portion SR2 and the second cover side portion W_SR2. Thus, the bonding force between the second panel side portion SR2 and the second cover side portion W_SR2 can be increased.

Further, similarly, the moved materials of the shape pad 200 may expand the sub-pad portion adjacent to the third panel side portion SR3 of the third panel bent portion of the target panel to increase the contact pressure between the third panel side portion SR3 and the third cover side portion W SR3. Thus, the bonding force between the third panel side portion SR3 and the third cover side portion W SR3 can be increased.

Similarly, the moved materials of the shape pad 200 may expand the sub-pad portion adjacent to the fourth panel side portion SR4 of the fourth panel bent portion of the target panel to increase the contact pressure between the fourth panel side portion SR4 and the fourth cover side portion W SR4. Thus, the bonding force between the fourth panel side portion SR4 and the fourth cover side portion W SR4 can be increased.

The lamination apparatus 2 includes the rigid cores 300a disposed inside the shape pad 200, thereby further facilitating the bonding between the target panel and the cover window 50_1 in a bending region of the target panel and the cover window 50_1 and a side region connected thereto.

Further, it is possible to reduce the contact pressure between the panel flat portion FR and the cover flat portion W_FR by reducing the pressing distance, i.e., the vertical movement distance, of the shape pad 200 for applying the same contact pressure between the first to fourth panel bent portions of the target panel and the first to fourth cover bent portions of the cover window 50_1. Accordingly, it is possible to prevent a phenomenon in which the contact pressure between the panel flat portion FR of the target panel and the cover flat portion W_FR of the cover window 50_1 becomes excessively large and the components (e.g., a plurality of conductive layers and insulating layers of the circuit layer) of the target panel are cracked due to the increased contact pressure and physically damaged, thereby preventing defects of the target panel.

Figure 15A:
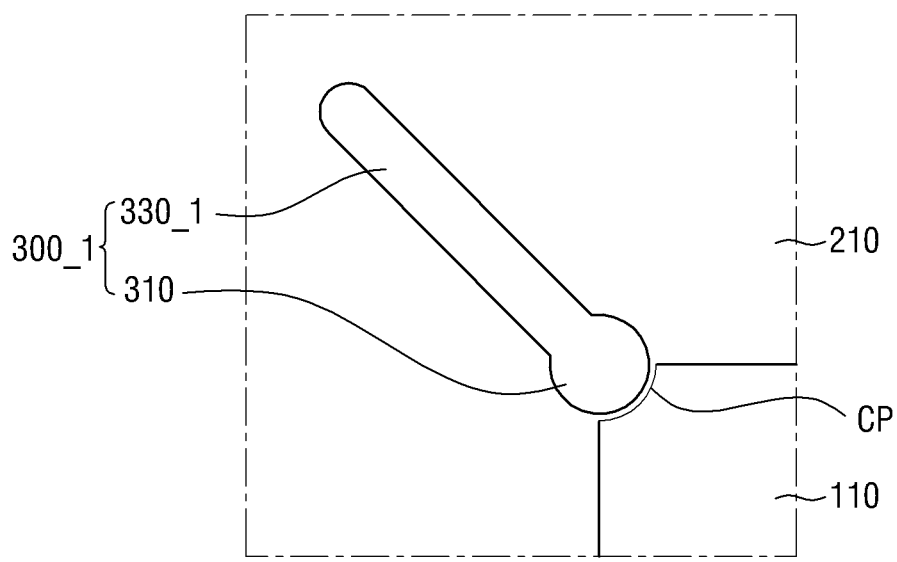
FIGS. 15A-C show cross-sectional views of exemplary embodiments of the rigid core of a lamination apparatus.
Figure 15B:
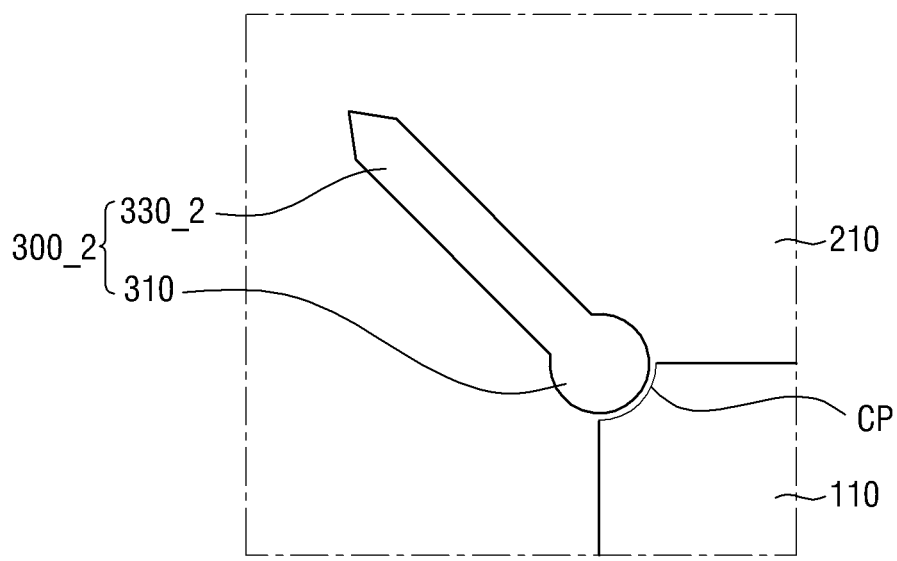
Figure 15C:
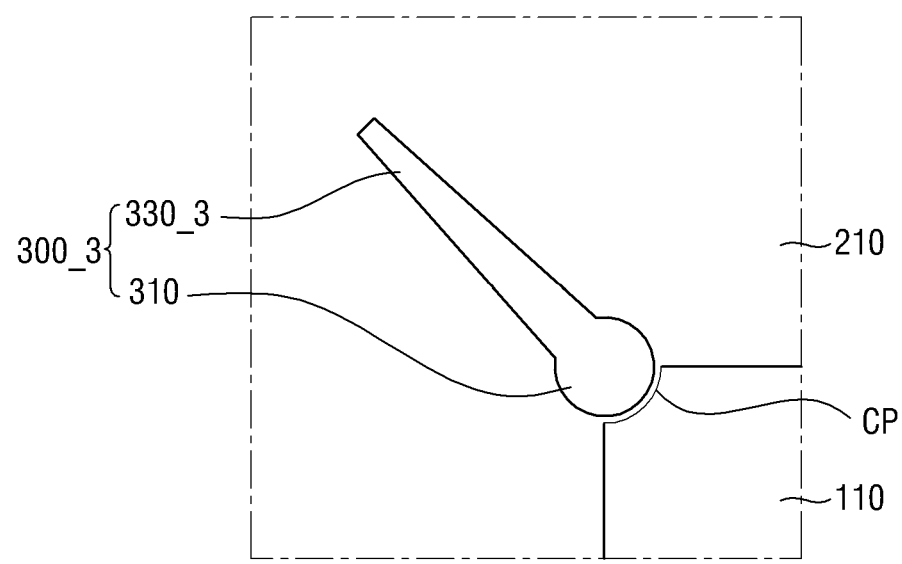

FIGS. 15A to 15C show cross-sectional views of exemplary embodiments of the rigid core of a lamination apparatus.

Referring to FIGS. 15A to C, the rigid cores of the lamination apparatus 2 can have various shapes.

More specifically, as shown in FIG. 15A, the ends of rigid cores 300_1 may have a curved shape.

Since the ends of the rigid cores 300_1 are formed in a curved shape, even if the ends of the rigid cores 300_1 are formed to extend beyond the surface of the shape pad 200, physical damage to the guide film and the target panel disposed thereabove can be prevented in advance.

As shown in FIG. 15B, the ends of rigid cores 300_2 may have a pointed, tip shape.

As shown in FIG. 15C, rigid cores 300_3 may have a reduced width from the core connection portions 310 to main core portion 330_3.

The lamination apparatus 2 includes the rigid cores 300_1, 300_2, 300_3 disposed inside the shape pad 200, thereby further facilitating the bonding between the target panel and the cover window in a bending region of the target panel and the cover window and a side region connected thereto.

Further, it is possible to reduce the contact pressure between the panel flat portion FR and the cover flat portion W_FR by reducing the pressing distance, i.e., the vertical movement distance, of the shape pad 200 for applying the same contact pressure between the first and second panel bent portions BS1 and BS2 of the target panel and the first and second cover bent portions W_BS1 and W_BS2 of the cover window.

Accordingly, it is possible to prevent a phenomenon in which the contact pressure between the panel flat portion FR of the target panel and the cover flat portion W_FR of the cover window becomes excessively large and the components (e.g., a plurality of conductive layers and insulating layers of the circuit layer) of the target panel are cracked due to the increased contact pressure and physically damaged, thereby preventing defects of the target panel.

Figure 16:
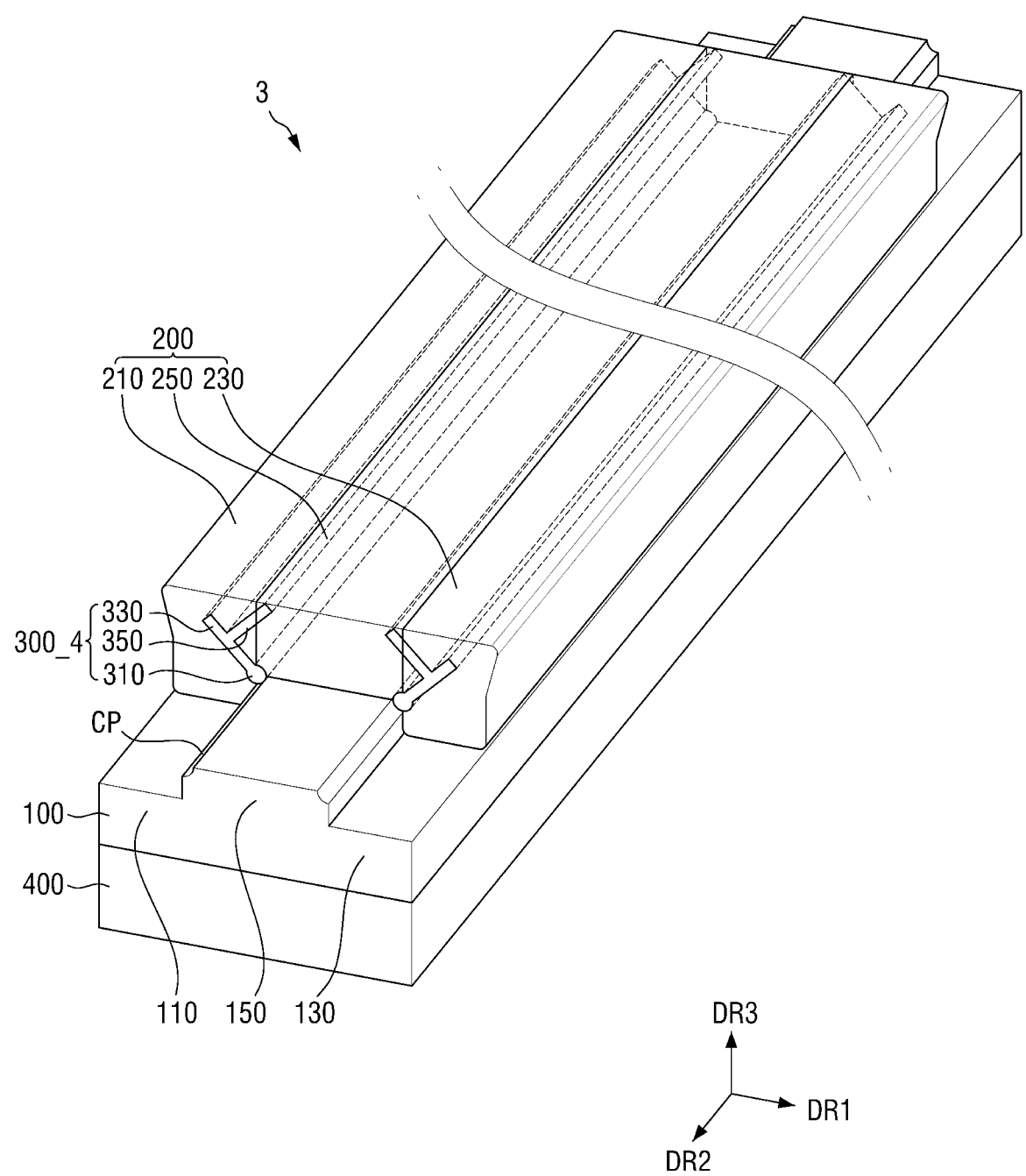
FIG. 16 is a perspective view of still another exemplary embodiment of a lamination apparatus constructed according to the principles of the invention.
Figure 17:
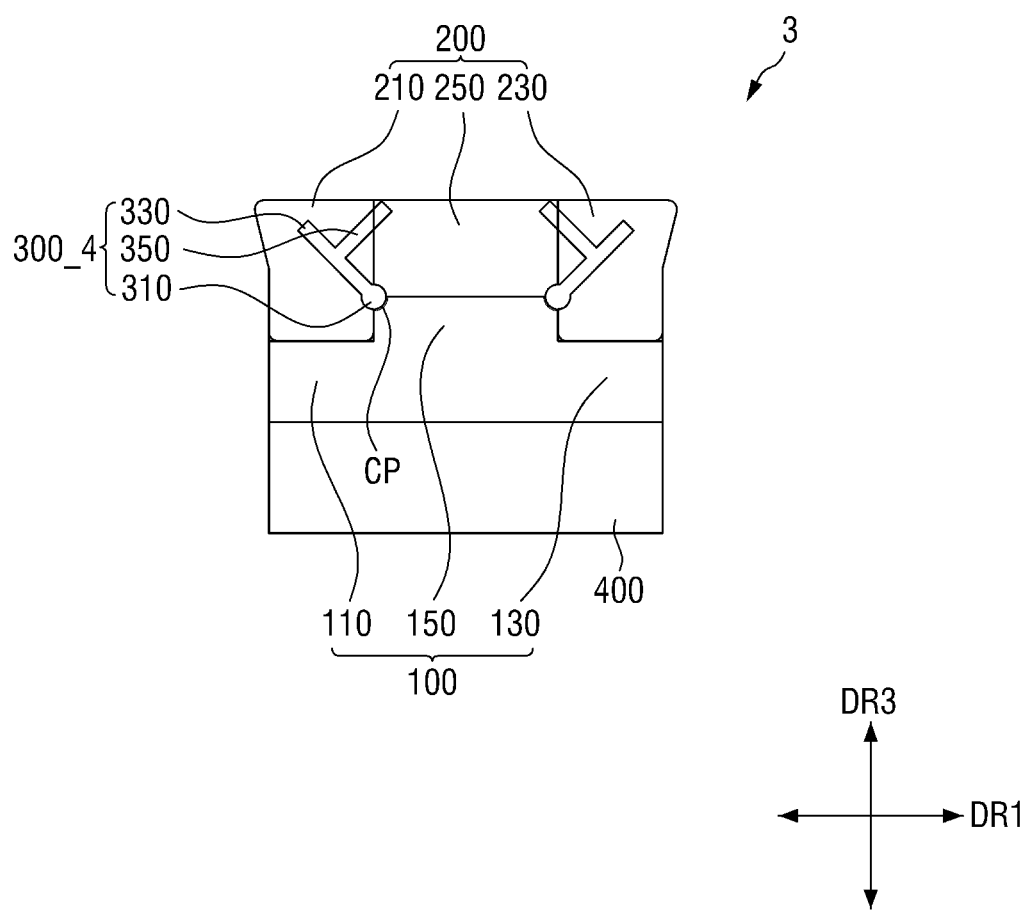
FIG. 17 is a cross-sectional view of the lamination apparatus of FIG. 16.

FIG. 16 is a perspective view of still another exemplary embodiment of a lamination apparatus constructed according to the principles of the invention. FIG. 17 is a cross-sectional view of the lamination apparatus of FIG. 16.

Referring to FIGS. 16 and 17, a lamination apparatus 3 is different from the lamination apparatus 1 according to the above-described exemplary embodiment in that rigid cores 300_4 further include sub-core portions.

More specifically, in the lamination apparatus 3, the rigid cores 300_4 may further include sub-core portions 350. The sub-core portions 350 may be physically connected to the main core portions 330 of the rigid cores 300_4. The extending direction of the sub-core portions 350 may intersect the extending direction of the main core portions 330.

The sub-core portions 350 may be in contact with the surface of the shape pad 200 to contact the guide film disposed thereabove. Since the sub-core portions 350 are in contact with the surface of the shape pad 200 to contact the guide film disposed thereabove, as described above, when the main core portions 330 move from the panel flat portion of the target panel to the panel bent portion, it is possible to control the moving speed of the main core portions 330. That is, the length of the sub-core portions 350 toward the surface of the shape pad 200 can be adjusted. For example, in order to reduce the moving speed of the main core portions 330, the length of the sub-core portions 350 toward the surface of the shape pad 200 may be increased to reduce the speed by the guide film in contact.

Further, since the sub-core portions 350 are formed to have a length such that they are in contact with the guide film, it is possible to prevent the main core portions 330 from moving back to the panel flat portion from the panel bent portion, thereby facilitating the bonding between the target panel and the cover window.

As shown in FIG. 16, the sub-core portions 350 may have a length equal to the extension length of the main core portions 330 in the second direction DR2 and may extend along the second direction DR2.

Figure 18:
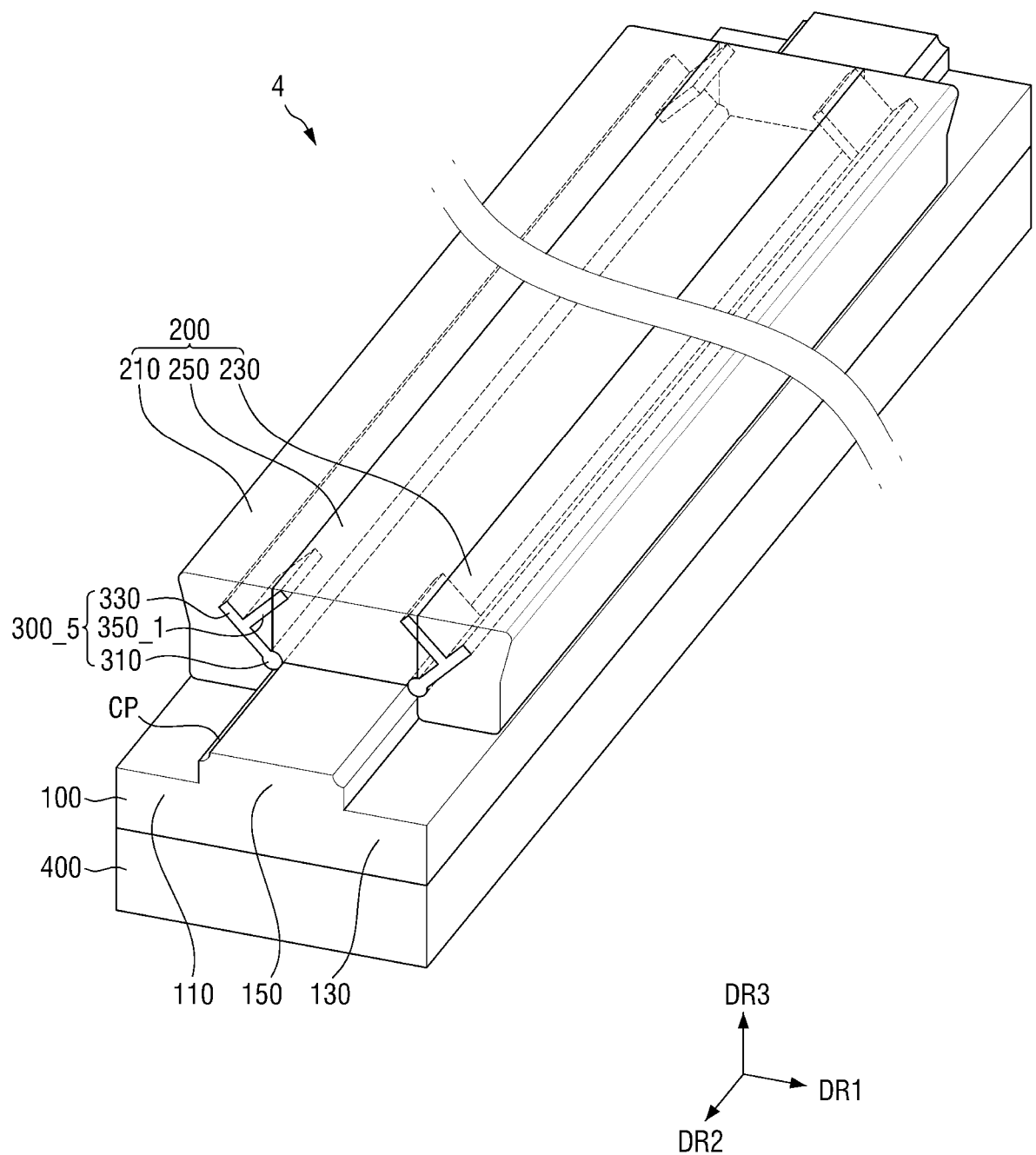
FIG. 18 is a perspective view of still another exemplary embodiment of a lamination apparatus constructed according to the principles of the invention.

FIG. 18 is a perspective view of still another exemplary embodiment of a lamination apparatus constructed according to the principles of the invention.

Referring to FIG. 18, a lamination apparatus 4 is different from the lamination apparatus according to the exemplary embodiment of FIGS. 16 and 17 in that sub-core portions 350_1 have the same length as the extension length of the main core portions 330 in the second direction DR2 and are disposed only at the outer end portions of the main core portions 330 in the second direction DR2 without extending along the second direction DR2.

More specifically, the sub-core portions 350_1 may have the same length as the extension length of the main core portions 330 in the second direction DR2 and may be disposed only at one end portion and the other end portion of the main core portions 330 in the second direction DR2 without extending along the second direction DR2. Therefore, it is possible to prevent the contact pressure from increasing throughout the entire area of the long side portions of the target panel by the sub-core portions 350_1 in contact with the guide film.

In some exemplary embodiments, without being limited thereto, the sub-core portion 350_1 may be disposed between the one end portion and the other end portion of the main core portion 330 in the second direction DR2. That is, the sub-core portion 350_1 may be disposed in a central region of the main core portion 330 in the second direction DR2.

Figure 19A:
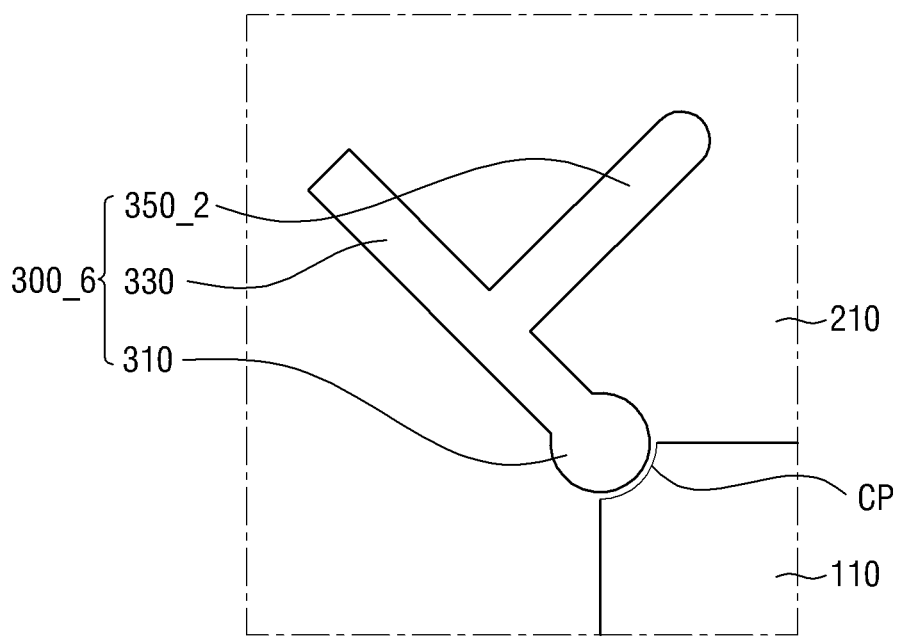
FIGS. 19A and 19B show cross-sectional views of other exemplary embodiments of the rigid core of a lamination apparatus.
Figure 19B:
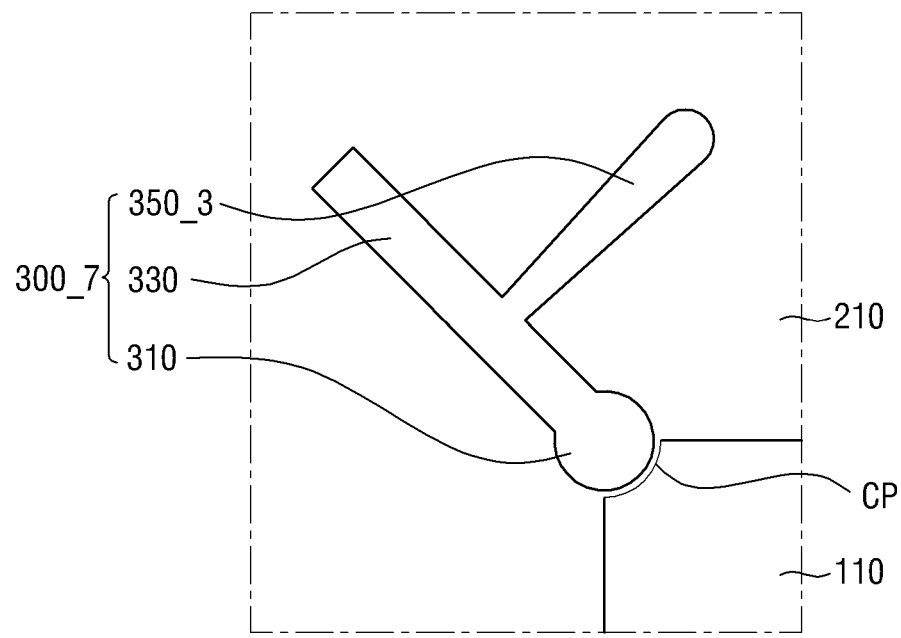

FIGS. 19A and 19B show cross-sectional views of other exemplary embodiments of the rigid core of a lamination apparatus.

Referring to FIGS. 19A and 19B, a lamination apparatus includes sub-core portions 350_2, 350_3 having a shape different from the shape of the sub-core portions 350 of the lamination apparatus according to the above-described exemplary embodiment.

More specifically, as shown in FIG. 19A, the ends of the sub-core portions 350_2 may have a curved shape.

Further, as shown in FIG. 19B, the sub-core portions 350_3 may have a width which gradually increases from portions connected to the main core portions 330 to the ends thereof. However, without being limited thereto, the sub-core portions 350_3 may have a width which gradually decreases from portions connected to the main core portions 330 to the ends thereof.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method for manufacturing a display device, the method comprising the steps of:
   placing a panel having a first portion and a second portion on a deformable pad having a core member;
   placing a cover window on the panel; and
   moving the core member disposed inside the pad from a first position adjacent the first portion to a second position adjacent the second portion of the panel and pressing the panel to bond the cover window to the panel.

2. The method of claim 1, wherein the second portion of the panel includes a panel bent portion adjacent to the first portion of the panel, and a panel side portion spaced apart from the first portion of the panel with the panel bent portion interposed therebetween, and
   the cover window includes a cover flat portion and a cover bent portion, the cover bent portion includes a cover bending portion adjacent to the cover flat portion, and a cover side portion spaced apart from the cover flat portion with the cover bending portion interposed therebetween.

3. The method of claim 2, wherein the step of the moving the core member and pressing the panel to bond the cover window to the panel further comprises the step of raising the pad to bond the first portion to the cover flat portion.

4. The method of claim 3, further comprising the step of: after raising the pad to bond the first portion to the cover flat portion, bonding the panel bending portion to the cover bending portion by pressing the panel bending portion with the core member.

5. The method of claim 4, further comprising the step of: after bonding the panel bending portion to the cover bending portion by pressing the panel bending portion with the core member, bonding the panel side portion to the cover side portion by pressing the panel side portion with the core member.

6. The method of claim 3, wherein the step of raising the pad to bond the first portion to the cover flat portion further comprises the step of pressing the pad to move a constituent material of the pad to a periphery thereof.

7. The method of claim 6, wherein the core member is moved from the first position to the second position by the constituent material of the pad moving to the periphery.

8. The method of claim 2, further comprising the step of placing a guide member between the shape pad and the panel, the guide member extending beyond opposite ends of the panel.

9. The method of claim 8, further comprising the step of fixing, with clamps, portions of the guide member extending beyond the ends of the pad.

10. The method of claim 9, further comprising the step of: after fixing, with clamps, portions of the guide member extending beyond the ends of the pad, lowering the clamps to lower the portions of the guide member extending beyond the ends of the pad.

11. The method of claim 10, further comprising the step of: after lowering the clamps to lower the portions of the guide member extending beyond the ends of the pad, moving roller portions fixed on the clamps toward the pad.

12. The method of claim 11, wherein when the roller portions fixed on the clamps are moved inwardly toward the shape pad, the second portion of the target panel is formed.

13. The method of claim 1, wherein the deformable pad comprises a shape pad and the core member comprises a rigid core connection portion connected to a support member disposed below the pad, and a main rigid core portion disposed inside the pad and connected to the rigid core connection portion.

14. The method of claim 13, wherein the core connection portion comprises a rotation axis of the main core portion, and
   the step of moving the core member and pressing the panel to bond the cover window to the panel further comprises the step of moving the main core portion from the first position to the second position with the core connection portion serving as a rotation axis.

15. The method of claim 14, wherein the core member further includes a sub-core portion extending in a direction intersecting a longitudinal direction of the main core portion.

16. The method of claim 15, wherein the step of moving the main core portion from the first position to the second position with the core connection portion as a rotation axis further comprises the step of bringing the sub-core portion into contact with a surface of the pad.

17. The method of claim 1, wherein the step of moving the core member and pressing the panel to bond the cover window to the panel further comprises the step of moving the core member without contacting any outer surfaces of the pad.

18. An apparatus for manufacturing a display device, the apparatus comprising:
   a support member;
   a motor disposed below the support member and operable to move the support member linearly;
   a deformable pad disposed on the support member; and
   a core member connected and disposed inside the support member.

19. The apparatus of claim 18, wherein the support member comprises a pad support having a main support portion, a first sub-support portion disposed on one side of the main support portion, and a second sub-support portion disposed on the other side of the main support portion, and the main support portion has a first thickness and the first sub-support portion has a second thickness and the second sub-support portion has a third thickness, with the first thickness being greater that the second or third thickness.

20. The apparatus of claim 19, wherein the main support portion comprises a groove recessed from a surface thereof, and the core member comprises a rigid core connection portion engaged with the groove of the main support portion and a main rigid core portion connected to the rigid core connection portion.

21. The apparatus of claim 20, wherein the deformable pad comprises a main pad portion overlapping the main support portion, a first sub-pad portion overlapping the first sub-support portion, and a second sub-pad portion overlapping the second sub-support portion, and the main pad portion, the first sub-pad portion and the second sub-pad portion have a substantially uniform surface height.

22. The apparatus of claim 21, wherein the main pad portion has a first thickness and the first sub-pad portion has a second thickness, with the first thickness being smaller than the second thickness.

23. The apparatus of claim 21, wherein the main core portion of the core member is disposed inside each of the first sub-pad portion and the second sub-pad portion of the deformable pad.

24. The apparatus of claim 23, wherein an end of the main core portion is located inside each of the first sub-pad portion and the second sub-pad portion.

25. The apparatus of claim 23, wherein the deformable pad comprises silicon (Si), and the main rigid core portion comprise a metal material.

26. The apparatus of claim 21, wherein the core member further includes a rigid sub-core portion connected to the rigid main core portion and extending in a direction intersecting a longitudinal axis of the rigid main core portion.

27. The apparatus of claim 26, wherein the rigid sub-core portion is in contact with surfaces of at least one of the first sub-pad portion and the second sub-pad portion.

28. The apparatus of claim 27, wherein an end of the sub-core portion has a pointed shape or a curved shape.

29. The apparatus of claim 20, wherein an end of the rigid main core portion has a pointed shape or a curved shape.

30. The apparatus of claim 20, wherein the rigid main core portion has a width that gradually decreases from a portion connected to the rigid core connection portion to an end of the rigid main core portion.

31. The apparatus of claim 18, wherein the support member includes a main support portion, a first sub-support portion disposed on one side of the main support portion in a first direction, a second sub-support portion disposed on the other side of the main support portion in the first direction, a third sub-support portion disposed on one side of the main support portion in a second direction intersecting the first direction, and a fourth sub-support portion disposed on the other side of the main support portion in the second direction, and the main support portion has a thickness greater than that of each of the sub-support portions.

* * * * *